(12) United States Patent
Lin et al.

(10) Patent No.: US 12,376,402 B2
(45) Date of Patent: Jul. 29, 2025

(54) TRANSPARENT REFRACTION STRUCTURE FOR AN IMAGE SENSOR AND METHODS OF FORMING THE SAME

(71) Applicant: Taiwan Semiconductor Manufacturing Company Limited, Hsinchu (TW)

(72) Inventors: Ming-Shiang Lin, Hsinchu (TW); Yun-Hao Chen, Hsinchu (TW); Kuo-Yu Wu, Zhubei (TW); Tse-Hua Lu, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 7 days.

(21) Appl. No.: 18/349,437

(22) Filed: Jul. 10, 2023

(65) Prior Publication Data
US 2023/0352507 A1   Nov. 2, 2023

Related U.S. Application Data

(62) Division of application No. 17/232,175, filed on Apr. 16, 2021, now Pat. No. 11,749,700.
(Continued)

(51) Int. Cl.
*H10F 39/00* (2025.01)
*H10F 39/12* (2025.01)

(52) U.S. Cl.
CPC ....... *H10F 39/8063* (2025.01); *H10F 39/024* (2025.01); *H10F 39/199* (2025.01); *H10F 39/807* (2025.01); *H10F 39/8053* (2025.01)

(58) Field of Classification Search
CPC ........... H01L 27/14627; H01L 27/1463; H01L 27/1464; H01L 27/14685; H01L 27/14621;
(Continued)

(56) References Cited

U.S. PATENT DOCUMENTS

| 2019/0296070 A1* | 9/2019 | Jin ........................ H10F 39/805 |
| 2020/0098798 A1* | 3/2020 | Takahashi ............. H10F 39/807 |

(Continued)

FOREIGN PATENT DOCUMENTS

| CN | 110383479 A | 10/2019 |
| CN | 110620121 A | 12/2019 |

(Continued)

OTHER PUBLICATIONS

Taiwan Patent and Trademark Office, Application No. 110116594, Office Action of Jan. 7, 2022, 8 pages.
(Continued)

*Primary Examiner* — Nelson Garces
(74) *Attorney, Agent, or Firm* — The Marbury Law Group, PLLC

(57) ABSTRACT

A plurality of photovoltaic junctions for a subpixel may be formed in a semiconductor substrate. After thinning the backside of the semiconductor substrate, at least one transparent refraction structure may be formed on the backside surface of the thinned semiconductor substrate. Each transparent refraction structure has a variable thickness that decreases with a lateral distance from a vertical axis passing through a geometrical center of the second-conductivity-type pillar structures for the subpixel. A subpixel optics assembly including an optical lens may be formed over the at least one transparent refraction structure. Each transparent refraction structure may reduce the tilt angle of light that propagate downward into the photodetectors, and increases total internal reflection of light and increase the efficiency of the photodetectors.

20 Claims, 35 Drawing Sheets

Related U.S. Application Data

(60) Provisional application No. 63/031,129, filed on May 28, 2020.

(58) Field of Classification Search
CPC .......... H01L 27/14629; H01L 27/1461; H01L 27/14612; H01L 27/14641; H01L 27/14689; H10F 39/014; H10F 39/024; H10F 39/18; H10F 39/199; H10F 39/8033; H10F 39/8053; H10F 39/806; H10F 39/8063; H10F 39/8067; H10F 39/807
See application file for complete search history.

(56) References Cited

U.S. PATENT DOCUMENTS

2020/0152682 A1    5/2020  Boriskin et al.
2020/0235149 A1*   7/2020  Shiraishi .................. G02B 7/34

FOREIGN PATENT DOCUMENTS

| CN | 110957335 A | 4/2020 |
| TW | 202011060 A | 3/2020 |
| TW | 202011594 A | 3/2020 |

OTHER PUBLICATIONS

Taiwan Patent and Trademark Office, Application No. 110116594, Office Action of Sep. 16, 2022, 4 pages.
Chinese Patent and Trademark Office, CN Application No. 202110593957.1, Office Action of Apr. 28, 2024, 9 pages.

\* cited by examiner

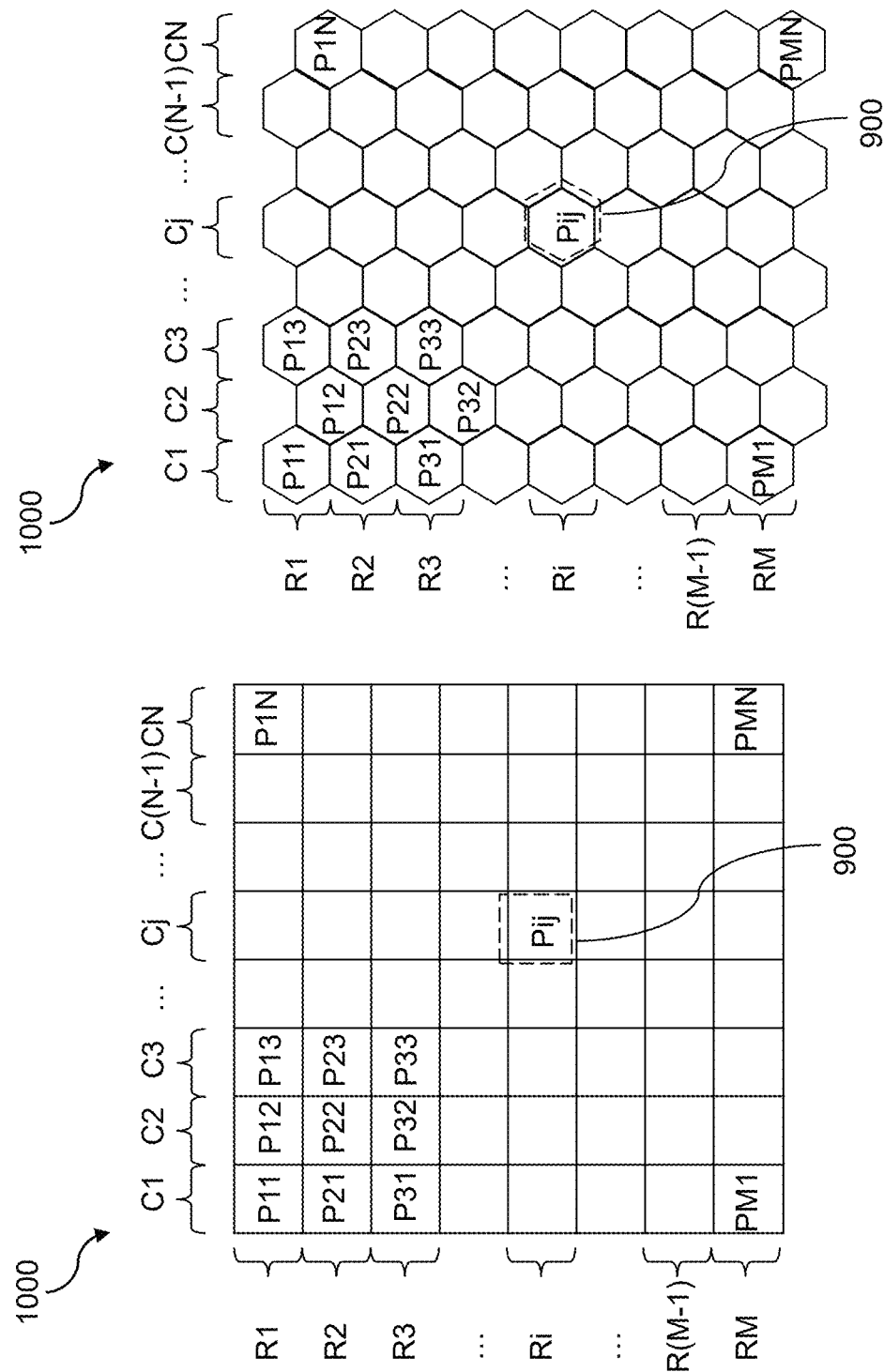

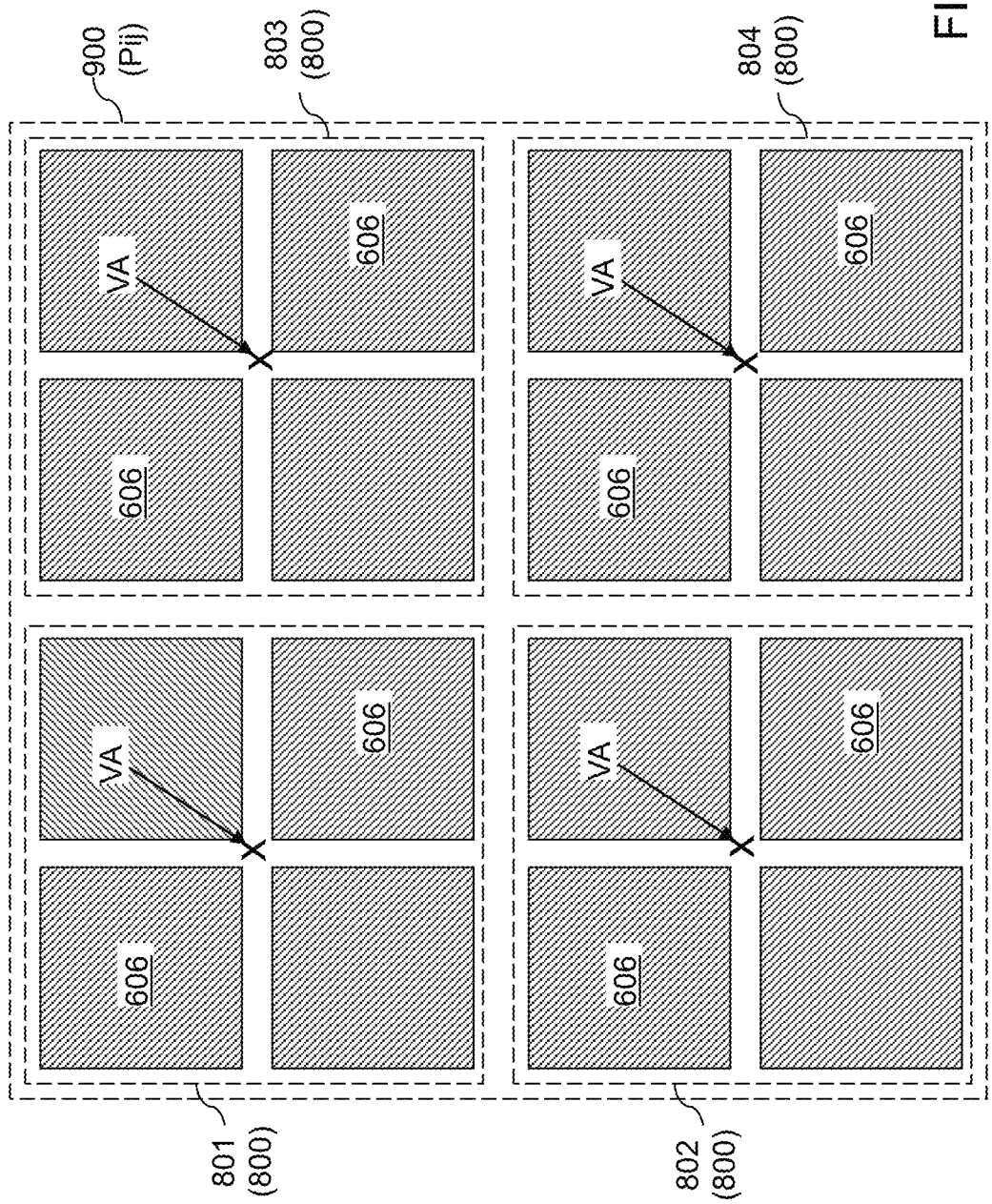

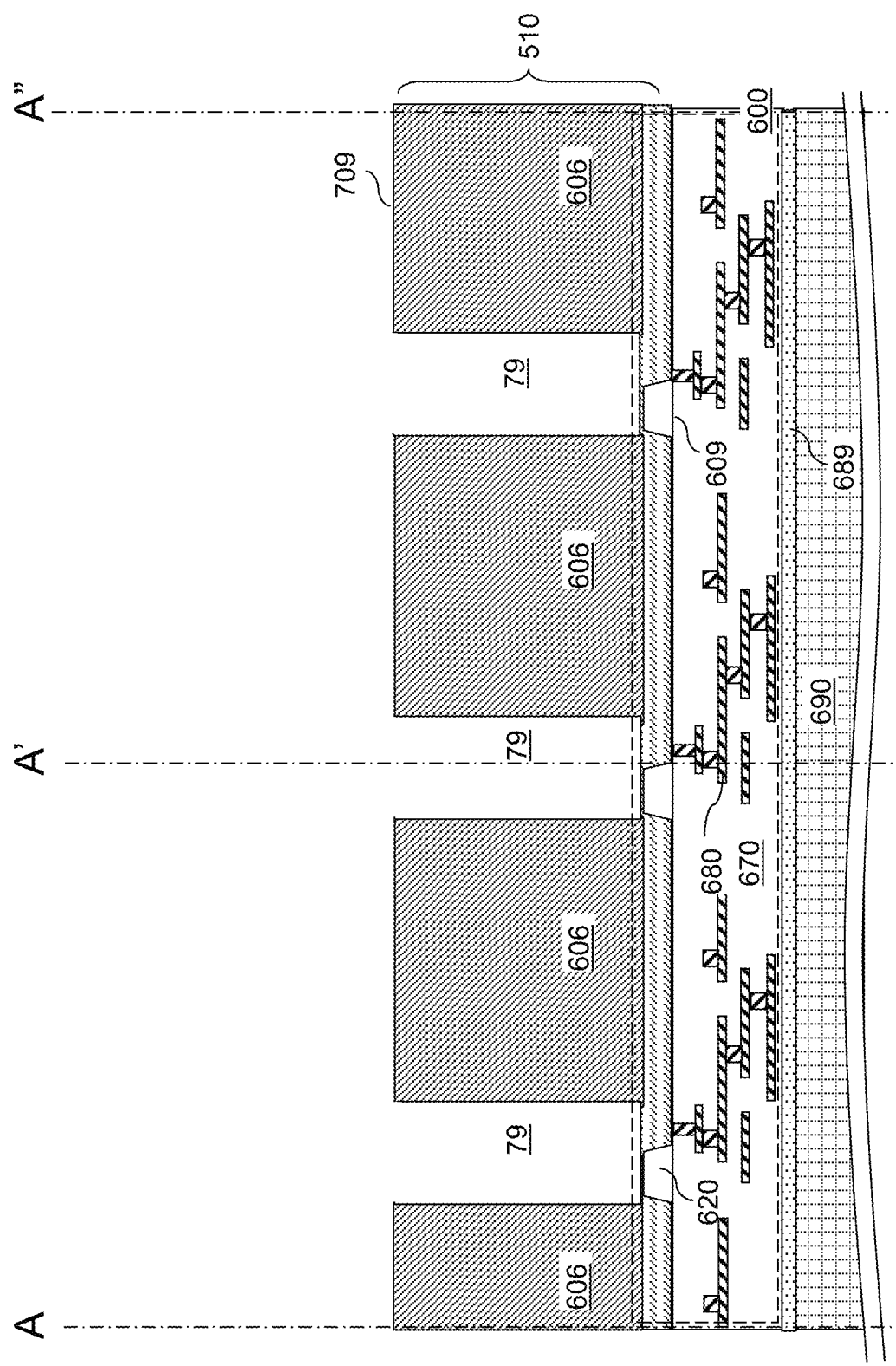

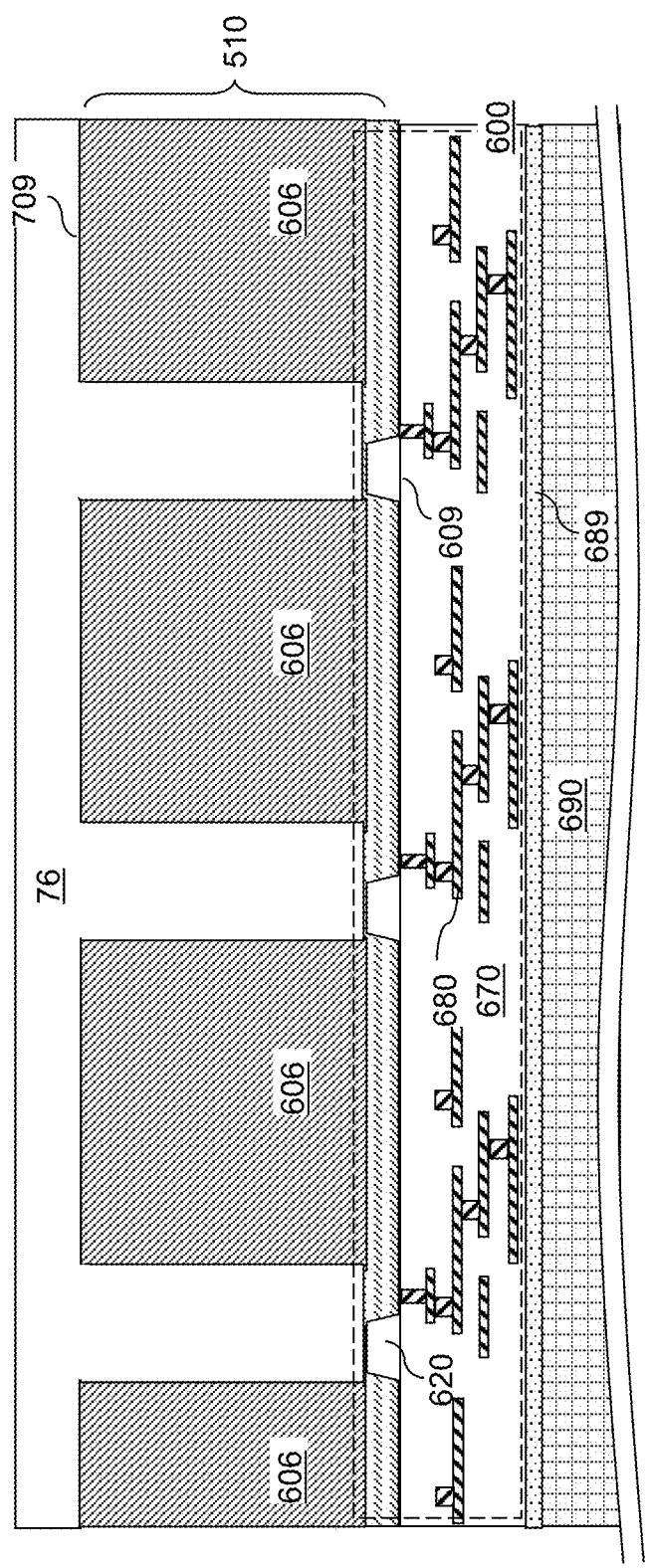

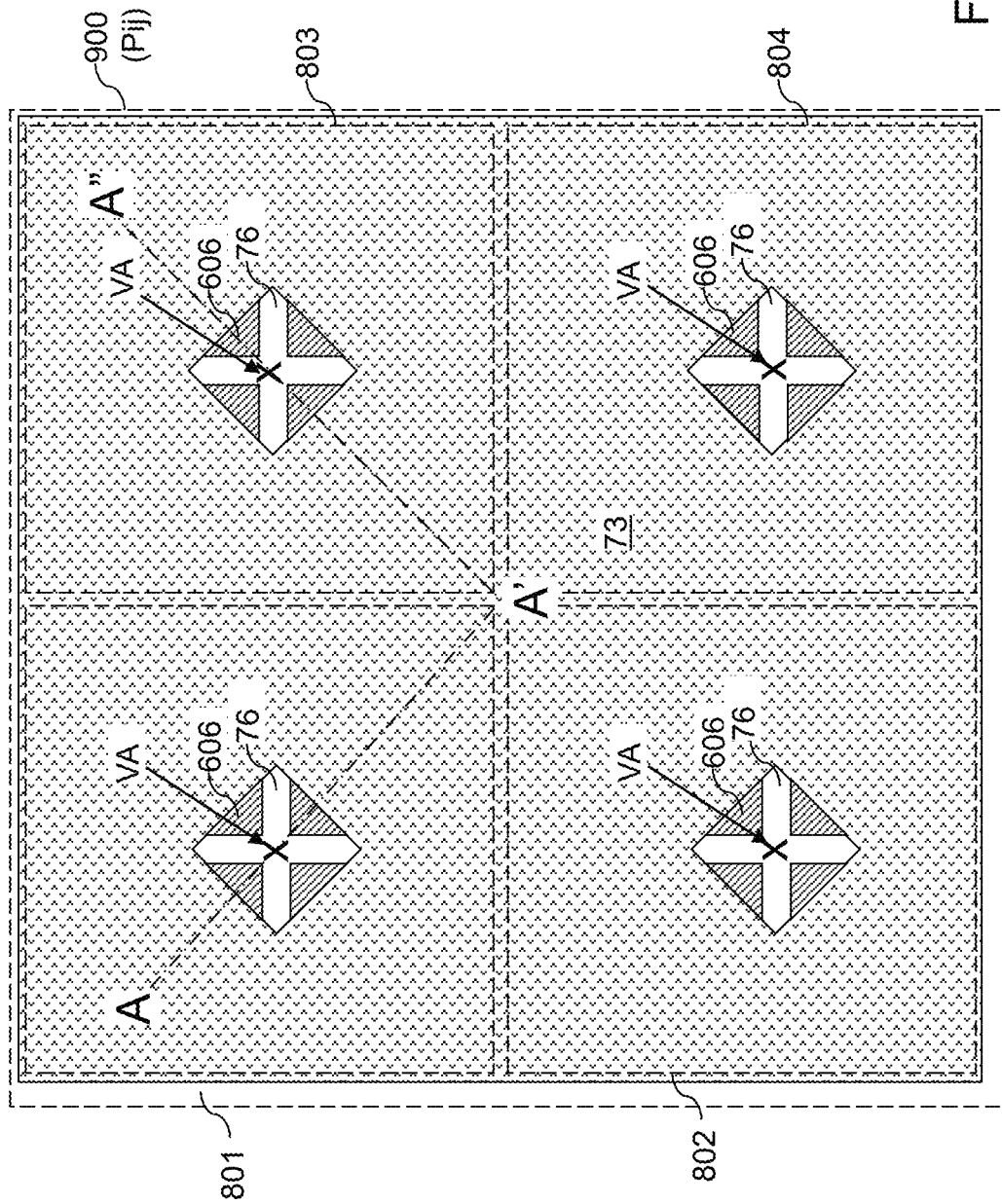

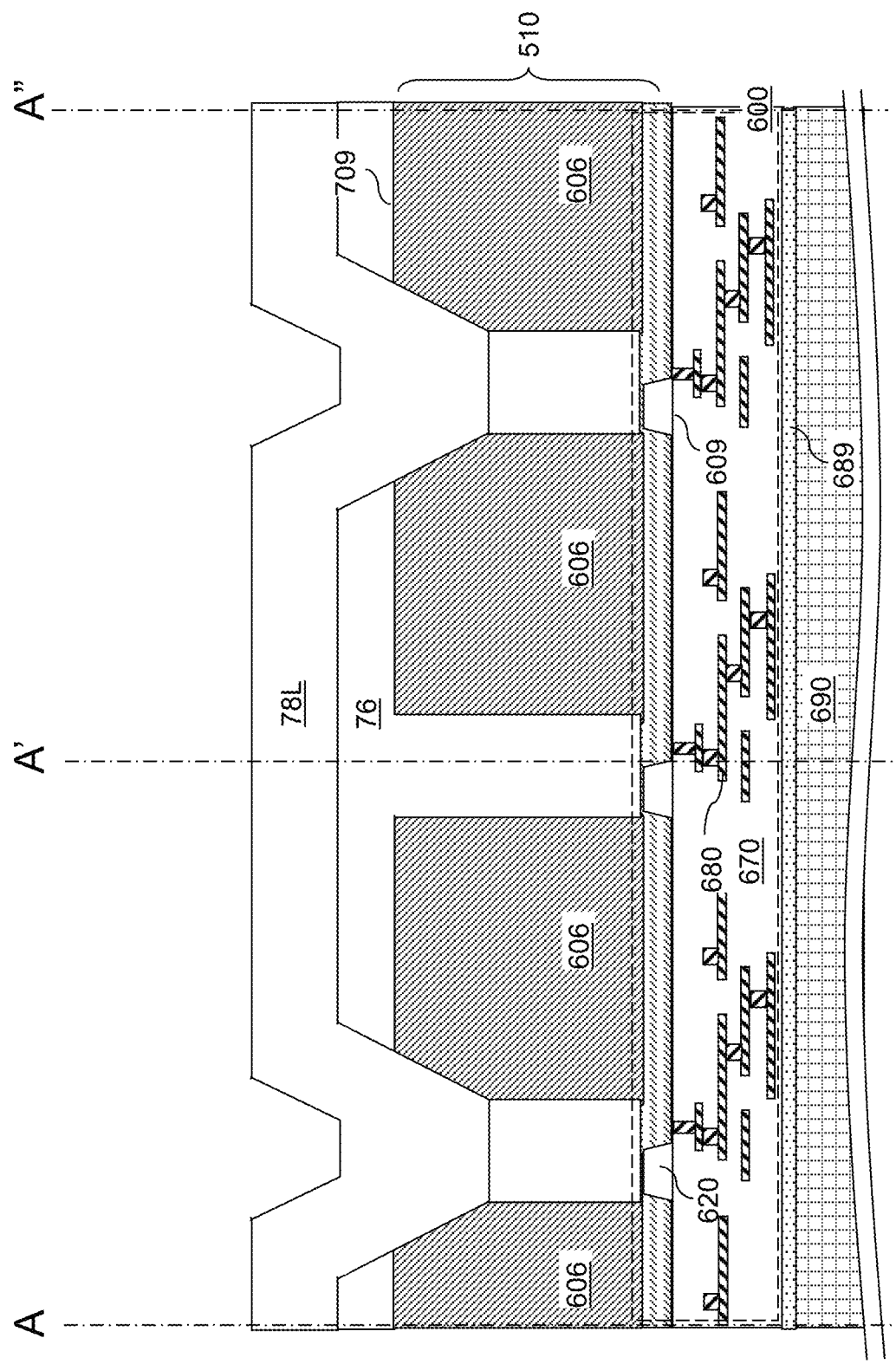

TRANSPARENT REFRACTION STRUCTURE FOR AN IMAGE SENSOR AND METHODS OF FORMING THE SAME

RELATED APPLICATIONS

This application is a divisional application of U.S. patent application Ser. No. 17/232,175 entitled "Transparent Refraction Structure for an Image Sensor and Methods of Forming the Same," filed on Apr. 16, 2021, which claims priority from U.S. Provisional Patent Application No. 63/031,129 entitled "Novel Structural Design of Deep Trench Isolation in CMOS Image Sensor" filed on May 28, 2020, the entire contents of both of which are hereby incorporated by reference for all purposes.

BACKGROUND

Semiconductor image sensors are used to sense electromagnetic radiation such as visible range light, infrared radiation, and/or ultraviolet light. Complementary metal-oxide-semiconductor (CMOS) image sensors (CIS) and charge-coupled device (CCD) sensors are used in various applications such as digital cameras or as embedded cameras in mobile devices. These devices utilize an array of image pixels (which may include photodiodes and transistors) to detect radiation using photogeneration of electron-hole pairs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a plan view of a first configuration for an array of image pixels of an image sensor according to an embodiment of the present disclosure.

FIG. 1B is a plan view of a second configuration for an array of image pixels of an image sensor according to another embodiment of the present disclosure.

FIGS. 3A-3D are horizontal cross-sectional views of various configurations of an image pixel at the level of the second-conductivity-type pillar structures according to embodiments of the present disclosure.

FIG. 6A is a vertical cross-sectional view of a region of an image pixel after formation of deep trenches according to an embodiment of the present disclosure. Vertical axes A, A', and A" are illustrated.

FIG. 7 is a vertical cross-sectional view of a region of an image pixel after formation of a deep trench isolation structure according to a first embodiment of the present disclosure.

FIG. 8B is a top-down view of the image pixel of FIG. 8A. The hinged vertical plane A-A'-A" corresponds to the plane of the vertical cross-sectional view of FIG. 8A that includes the vertical axes A, A', and A".

FIG. 9A is a vertical cross-sectional view of a region of an image pixel after formation of a transparent dielectric material layer according to the first embodiment of the present disclosure. Vertical axes A, A', and A" are illustrated.

DETAILED DESCRIPTION

Figure 2A:
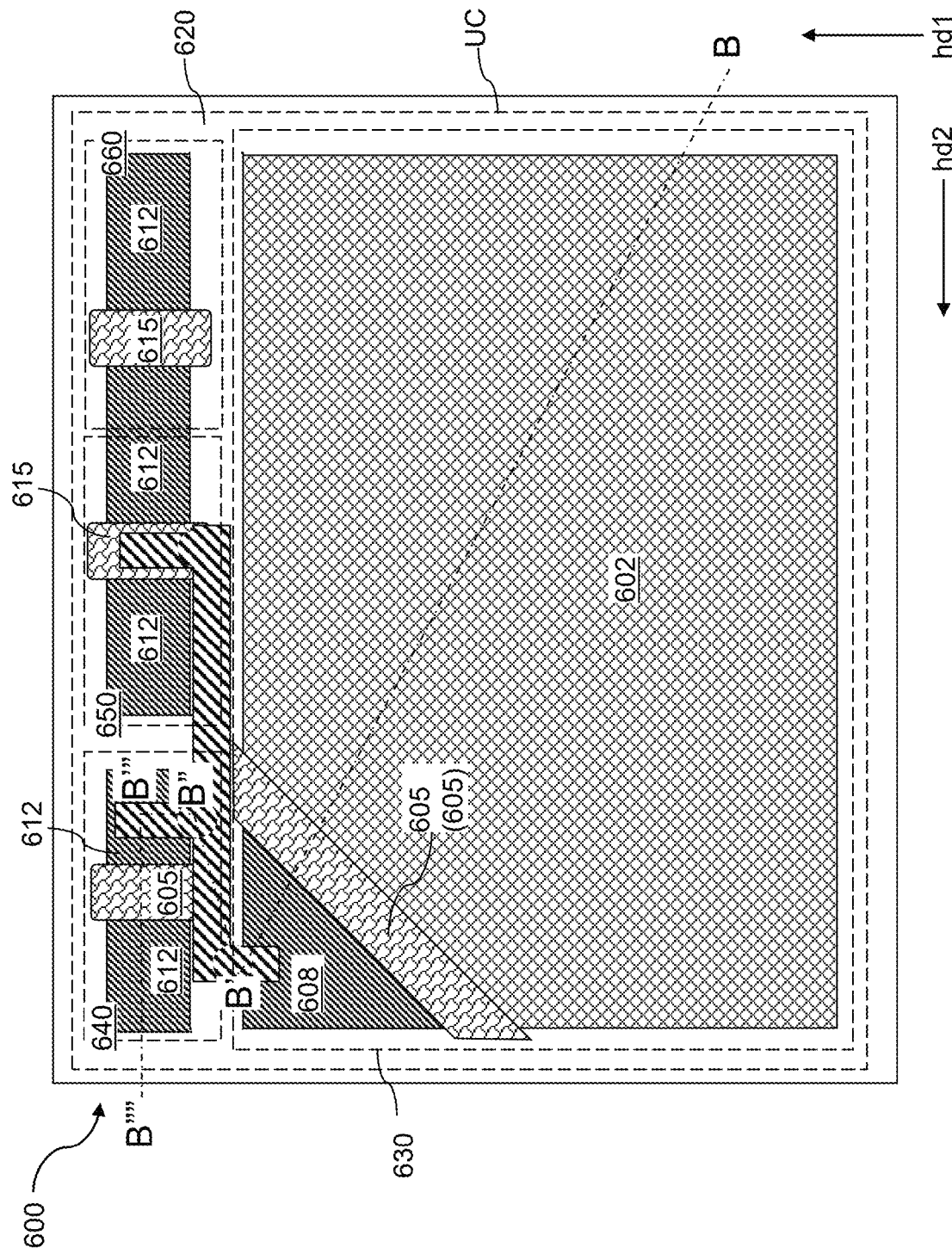
FIG. 2A is a plan view of front-side sensor components within the area of a subpixel in an exemplary structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor image sensors are used for sensing light. Complementary metal-oxide semiconductor (CMOS) image sensors (CIS) and charge-coupled device (CCD) sensors are widely used in various applications such as digital still camera or mobile phone camera applications. These image sensor devices utilize an array of pixels in a substrate, including photodiodes and transistors, that may absorb radiation projected toward the substrate and convert the sensed radiation into electrical signals. A back side illuminated (BSI) image sensor device is one type of image sensor device. As transistor device size shrinks with each technology generation, existing BSI image sensor devices may begin to suffer from issues related to cross-talk and blooming. These issues may be caused by insufficient isolation between neighboring pixels of the BSI image sensor, especially for pixel array architecture with full phase detection auto-focusing (PDAF) function. Therefore, while existing methods of fabricating BSI image sensor devices have been generally adequate for their intended purposes, they have not been entirely satisfactory in every aspect.

The various embodiments disclosed herein are directed to semiconductor devices, and specifically to an image sensor including transparent refraction structures underlying an optical lens. The various embodiment image sensors may be configured to refract light toward a vertical direction in order to increase the probability of total reflection at interfaces between photodiode layers and a deep trench isolation structure. The various embodiments include methods of manufacturing the same. Generally, the higher the percentage of photons kept within a subpixel, the lower the percentage of photons that escape to neighboring image pixels and cause degradation in image resolution. According to an embodiment, the image resolution of an image sensor may be enhanced by increasing the probability of total reflection for photons that impinge into each subpixel. According to an embodiment, a transparent refraction structure may be used in addition to an optical lens to align the direction of incident photons along a vertical direction, thereby increasing the angle of incidence of photons at vertical interfaces between photodiode layers and the deep trench isolation structure and increasing the probability of total reflection at the vertical interfaces between photodiode layers and the deep trench isolation structure. Thus, photons impinging into a subpixel has a higher probability of staying within the subpixel before detection by a photodiode layer within the subpixel. An image sensor with a higher image resolution may be thus provided.

Referring to FIGS. 1A and 1B, a first configuration for an array 1000 of image pixels 900 of an image sensor and a second configuration of an array 1000 of image pixels 900 of an image sensor are illustrated in a respective plan view. The image sensor may be a backside illuminated (BSI) image sensor device. However, it should be appreciated that embodiments of the disclosure may be used in a front-side illuminated (FSI) image sensor.

Each image pixel 900 represents a smallest unit area for the purpose of generating an image from the image sensor. The region including the array 1000 of image pixels 900 is herein referred to as an image pixel array region. The image pixels 900 in the image pixel array region may be arranged in rows and columns. For example, the image pixel array region may include M rows and N columns, in which M and N are integers in a range from 1 to 216, such as from 28 to 214. The rows of image pixels 900 may be consecutively numbered with integers that range from 1 to M, and the columns of image pixels 900 may be consecutively numbered with integers that range from 1 to N. A image pixel $P_{ij}$ refers to a image pixel 900 in the i-th row and in the j-th column.

Each image pixel 900 includes at least one photodetector that is configured to detect radiation of a given wavelength range. Each image pixel 900 may include a plurality of photodetectors configured to detect radiation of a respective wavelength range, which may be different from each of the plurality of photodetectors. In one embodiment, each image pixel 900 may include a plurality of subpixels, each of which including a respective combination of a photodetector and an electronic circuit configured to detect radiation that impinged into the photodetector. For example, a image pixel 900 may include a subpixel configured to detect radiation in a red wavelength range (such as a range from 635 nm to 700 nm), a subpixel configured to detect radiation in a green wavelength range (such as a range from 520 nm to 560 nm), and a subpixel configured to detect radiation in a blue wavelength range (such as a range from 450 nm to 490 nm). Such subpixels are referred to as a red subpixel, green subpixel, and a blue subpixel, respectively.

Generally, an image pixel 900 generates information in impinging radiation for a unit detection area. A subpixel generates information on the intensity of the impinging radiation within a specific wavelength range as detected within a region of the unit detection area. A monochromatic image pixel 900 may include only a single subpixel. An image pixel 900 configured to detect spectral distribution of impinging radiation includes multiple subpixels having at least two different detection wavelength ranges. Photodetectors in an image pixel array region may include photodiodes, complimentary metal-oxide-semiconductor (CMOS) image sensors, charged coupling device (CCD) sensors, active sensors, passive sensors, other applicable sensors, or a combination thereof.

A predominant subset of the image pixels 900 within each array 1000 of image pixels 900 of an image sensor comprises image pixels, which are image pixels that are used to generate a two-dimensional image. Another subset of the image pixels 900 within each array 1000 of image pixels 900 of the image sensor may comprise black level correction (BLC) image pixels, which are image pixels that are used to determine the black level correction signals. Generally, each subpixel within a BLC image pixel measures the electrical charges that accumulate within a respective photodiode region in the absence of impinging light. In one embodiment, the BLC image pixels may be arranged around the frame of the array 1000 of image pixels 900 of the image sensor. In an illustrative example, the BLC image pixels may include the first row image pixels (such as image pixels $P_{ij}$ in which the index j varies from 1 to N), the last row image pixels (such as the M-th row image pixels $P_{Mj}$ in which the index j varies from 1 to N), the first column image pixels (such as image pixels $P_{i1}$ in which the index i varies from 1 to M), and the last column image pixels (such as image pixels Pin in which the index i varies from 1 to M).

Figure 2B:
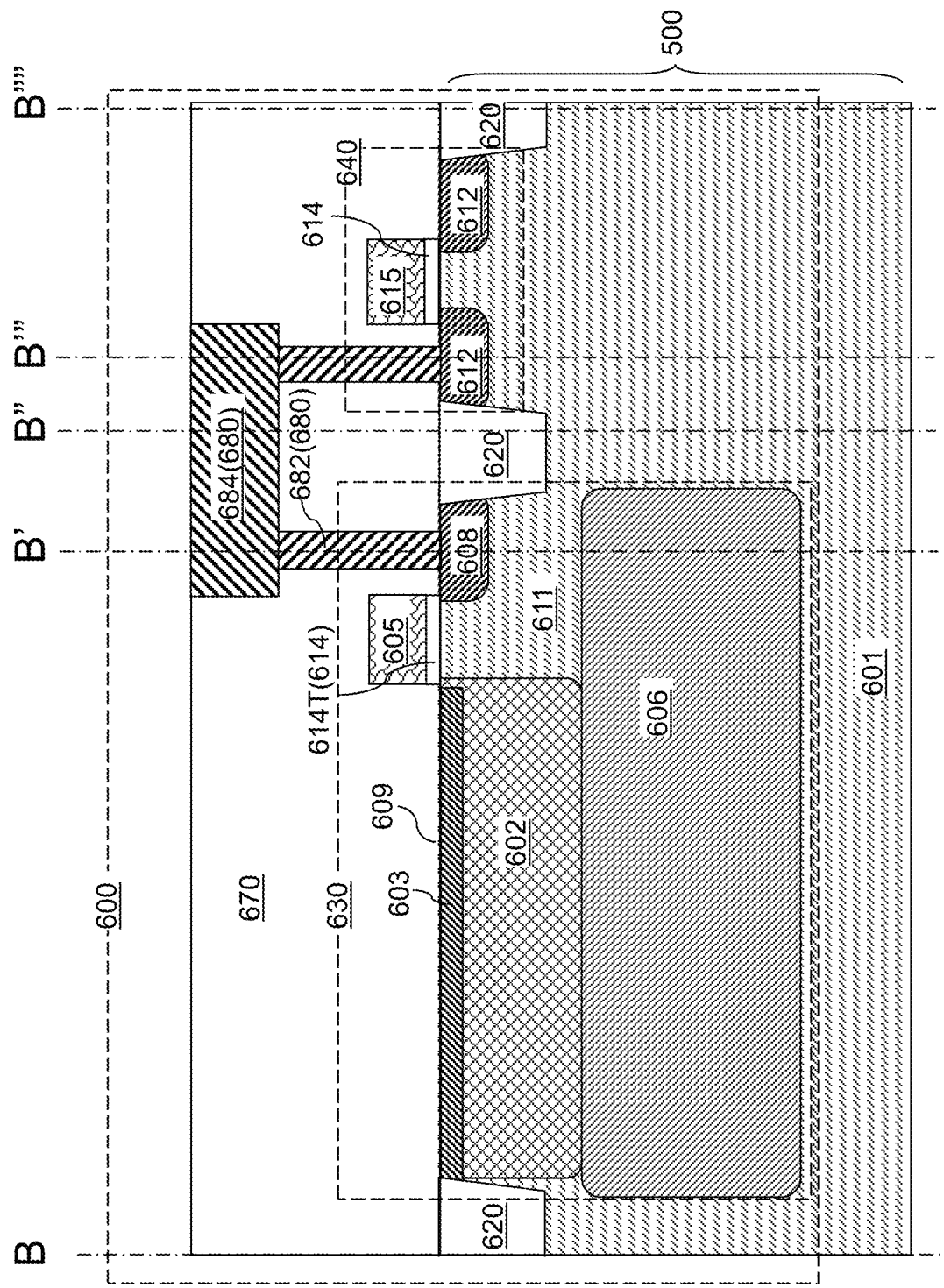
FIG. 2B is a vertical cross-sectional view of the exemplary structure along the hinged vertical plane B-B'-B"-B'''-B"" of FIG. 2A.

FIG. 2A is a plan view of front-side sensor components within the area of a subpixel in an exemplary structure according to an embodiment of the present disclosure. FIG. 2B is a vertical cross-sectional view of the exemplary structure along the hinged vertical plane B-B'-B''-B'''-B'''' of FIG. 2A. Referring to FIGS. 2A and 2B together, a photodetector circuit in an exemplary structure is illustrated, which includes a set of front-side sensor components 600 within the area of a subpixel. Front-side sensor components 600 refer to all components of the image sensor that may be formed on the front surface 609 of a semiconductor substrate 500, or may be formed within the substrate semiconductor layer 601. The photodetector circuit includes a photodetector (comprising a transfer transistor 630) and a sensing circuit (640, 650, 660) that includes a reset transistor 640, a source follower transistor 650, and a select transistor 660.

Each subpixel includes a respective photodetector circuit, which includes a subset of the front-side sensor components 600 that may be located within the area of a subpixel. A set of at least one subpixel 800 may be used for an image pixel 900. Each subpixel comprises a unit cell ("UC"), which may be repeated along at least one horizontal direction to provide front-side sensor components 600 for a single image pixel, which may include a single subpixel, two subpixels, or three or more subpixels. In one embodiment, multiple instances of the unit cell UC may be repeated along at least one horizontal direction. For example, the unit cell UC may be repeated as a two-dimensional array of unit cells UC that are replicated with a first periodicity along a first horizontal direction hd1 and with a second periodicity along a second horizontal direction hd2. As discussed above with reference to FIGS. 1A and 1B, the two-dimensional array may be a rectangular array or a hexagonal array. As such, the second horizontal direction hd2 may, or may not, be perpendicular to the first horizontal direction hd1.

Referring back to FIGS. 2A and 2B, the semiconductor substrate 500 includes a substrate semiconductor layer 601. Each subpixel may be formed on, or in, the substrate semiconductor layer 601, which has a front surface 609 and a back surface. The substrate semiconductor layer 601 includes a semiconductor material such as silicon, germanium, a silicon-germanium alloy, a compound semiconductor material, or another semiconductor material having a band gap that that does not exceed the energy of the photons to be detected. The material within the substrate semiconductor layer 601 may be selected based on the energy range of the photons to be detected by the subpixel. In one embodiment, the substrate semiconductor layer 601 may include single crystalline silicon. A commercially available single crystalline semiconductor substrate may be used for the semiconductor substrate 500. The semiconductor substrate 500 as provided at this processing step has a sufficiently high thickness to be able to withstand standard complementary metal-oxide-semiconductor (CMOS) processing steps. For example, the thickness of the semiconductor substrate 500 may be in a range from 200 microns to 1 mm, although lesser and greater thicknesses may also be used.

A top portion of the substrate semiconductor layer 601 may be suitably doped to have a first conductivity type, which may be p-type or n-type. For example, an epitaxial semiconductor deposition process may be performed to form a single crystalline epitaxial semiconductor material layer at an upper portion of the substrate semiconductor layer such that the atomic concentration of the dopants of the first conductivity type is in a range from $1.0 \times 10^{13}/cm^3$ to $1.0 \times 10^{16}/cm^3$, although lesser and greater atomic concentrations may also be used. The thickness of the single crystalline epitaxial semiconductor material layer may be in a range from 1 micron to 10 microns.

First-conductivity-type wells may be formed by ion implantation around regions in which shallow trench isolation structures 620 may be subsequently formed. The atomic concentration of dopants of the first conductivity type in the first-conductivity-type wells may be in a range from $1.0 \times 10^{15}/cm^3$ to $1.0 \times 10^{18}/cm^3$, although lesser and greater atomic concentrations may also be used. Shallow trench isolation structures 620 may be formed to provide electrical isolation to and from the various components within the subpixel.

Dopants of a second conductivity type may be implanted through the front surface 609 of the semiconductor substrate 500 using at least one masked ion implantation process. The second conductivity type is the opposite of the first conductivity type. For example, if the first conductivity type is p-type, the second conductivity type is n-type, and vice versa. Various doped regions having a doping of the second conductivity type is formed by the at least one masked ion implantation process. A source second-conductivity-type photodiode layer 602 may be formed underneath the front surface 609 of the semiconductor substrate 500 in each unit cell UC such that a periphery of the source second-conductivity-type photodiode layer 602 overlaps with an edge of the transfer gate electrode 605 in a plan view. The lateral extent of the source second-conductivity-type photodiode layer 602 may be limited to one side of a transfer gate electrode to be subsequently formed. Thus, the edge of the source second-conductivity-type photodiode layer 602 may be laterally spaced from the shallow trench isolation structures 620 by a region in which a transfer gate electrode and a floating diffusion region may be subsequently formed.

A second-conductivity-type pillar structure 606 may be formed underneath the source second-conductivity-type photodiode layer 602 at the depth of the bottom portions of the first-conductivity-type wells by implanting dopants of the second conductivity type with a higher implantation energy than during the implantation process that forms the source second-conductivity-type photodiode layer 602. The second-conductivity-type pillar structure 606 may adjoin the first-conductivity-type wells. In one embodiment, each second-conductivity-type pillar structure 606 may have a periphery that adjoins the first-conductivity-type wells. Each combination of a second-conductivity-type pillar structure 606 and a source second-conductivity-type photodiode layer 602 is collectively referred to as a second-conductivity-type photodiode layer (602, 606).

In one embodiment, the depth of the top surface of the second-conductivity-type pillar structure 606 may be in a range from 400 nm to 1,500 nm, although lesser and greater depths may also be used. In one embodiment, the depth of the bottom surface of the second-conductivity-type pillar structure 606 may be in a range from 800 nm to 2,500 nm, although lesser and greater depths may also be used.

The unimplanted portion of the substrate semiconductor layer 601 that overlies the second-conductivity-type pillar structure 606 may have a doping of the first conductivity type, and may be subsequently used as a body region of a transfer transistor. As such, the unimplanted portion of the substrate semiconductor layer 601 that overlies the second-conductivity-type pillar structure 606 is herein referred to as a transfer transistor body region 611. In one embodiment, the second-conductivity-type pillar structure 606 may have the same lateral extent as a transfer transistor 630 to be subsequently formed, and may coincide with the portion of the shallow trench isolation structure 620 that encircles the combination of the source second-conductivity-type photodiode layer 602 and the transfer transistor body region 611.

Gate stack structures (614, 605, 615) may be formed over the front surface 609 of the semiconductor substrate 500 by depositing and patterning a layer stack including a gate dielectric layer and a gate electrode layer. Each patterned portion of the layer stack constitutes a gate stack structure (614, 605, 615), which may be a transfer gate stack structure (614T, 605) and a control gate stack structure (614, 615). Each transfer gate stack structure (614T, 605) includes a gate dielectric, which is herein referred to as a transfer gate dielectric 614T, and a gate electrode, which is herein referred to as a transfer gate electrode 605. Each transfer gate stack structure (614T, 605) is located between the source second-conductivity-type photodiode layer 602 and the floating diffusion region 608. Each control gate stack structure (614, 615) includes a gate dielectric 614 and a gate electrode 615.

Each of the control gate stack structures (614, 615) includes a respective layer stack of a gate dielectric 614 and a gate electrode 615 of other transistors in a sensing circuit, which may include a reset transistor 640, a source follower transistor 650, a select transistor 660, and other suitable transistors that may be used to amplify the signal generated by the photodetector of the subpixel.

Various active regions (608, 612) having a doping of the second conductivity type may be formed. The various active regions (608, 612) may include a floating diffusion region 608 that functions as the drain region of the transfer transistor 630. Current flow between the source second-conductivity-type photodiode layer 602 and the floating diffusion region 608 may be controlled by the transfer gate electrode 605.

The source second-conductivity-type photodiode layer 602 may accumulate electrical charges (such as electrons in embodiments in which the second conductivity type is n-type) during sensing (i.e., while the subpixel actively detects the photons impinging thereupon, for example, for the purpose of taking a frame or a photo) and may function as the source region of the transfer transistor 630. The active regions 612 include source regions and drain regions of the various transistors (640, 650, 660) in the sensing circuit. The floating diffusion regions 608 may be vertically spaced from the second-conductivity-type pillar structure 606 by the transfer transistor body region 611.

The floating diffusion region 608 and the active regions 612 of each unit cell UC may be formed by ion implantation of dopants of the second conductivity type using masked ion implantation processes. The combination of a respective patterned photoresist layer and the gate stack structures (614, 605, 615) may be used as ion implantation blocking structures (i.e., masking structures) during the ion implantation processes. The depth of the bottom surface of the floating diffusion regions 608 may be in a range from 100 nm to 400 nm, such as from 150 nm to 250 nm, although lesser and greater depths may also be used. The depth of the bottom surfaces of the active regions 612 may be in a range from 100 nm to 600 nm, such as from 150 nm to 400 nm, although lesser and greater depths may also be used.

A first-conductivity-type pinning layer 603 may be formed directly on top of the source second-conductivity-type photodiode layer 602 by ion implantation of dopants of the first conductivity type. The first-conductivity-type pinning layer 603 suppresses depletion of the interface between the source second-conductivity-type photodiode layer 602 and the first-conductivity-type pinning layer 603, and electrically stabilizes the source second-conductivity-type photodiode layer 602. The first-conductivity-type pinning layer 603 is omitted in all of the top-down views of the various exemplary structures of the present disclosure in order to clearly illustrate the lateral extent of the source second-conductivity-type photodiode layer 602 that underlies the first-conductivity-type pinning layer 603. The depth of the p-n junction between the first-conductivity-type pinning layer 603 and the source second-conductivity-type photodiode layer 602 may be in a range from 5 nm to 100 nm, although lesser and greater depths may also be used. The first-conductivity-type pinning layer 603 forms an additional p-n junction with the source second-conductivity-type photodiode layer 602 in addition to the p-n junction between the source second-conductivity-type photodiode layer 602 and the substrate semiconductor layer 601.

Interconnect-level dielectric layers 670 may be formed over the front surface 609 of the semiconductor substrate 500, and metal interconnect structures 680 connecting the various nodes of the transistors (630, 640, 650, 660) may be formed within each subpixel. The interconnect-level dielectric layers 670 may include a respective dielectric material such as undoped silicate glass, a doped silicate glass, organosilicate glass, a porous dielectric material, or combinations thereof. Dielectric liners including various dielectric materials (such as silicon nitride, silicon oxynitride, silicon oxide carbide, and/or dielectric metal oxides) may be optionally used in the interconnect-level dielectric layers 670. The metal interconnect structures 680 may include various metal via structures 682 (680) and various metal line structures 684 (680). For example, each of the floating diffusion regions 608 may be connected to the gate electrode 615 of a respective source follower transistor 650 by a subset of the metal interconnect structures 680. A photodetector may comprise a transfer transistor 630, and may be connected to a sense circuit including additional transistors (640, 650, 660).

The sensing circuit (640, 650, 660) includes a set of a reset transistor 640, a source follower transistor 650, and a select transistor 660. Generally, the sensing circuit (640, 650, 660) of each subpixel may be provided within the area of the unit cell UC. In one embodiment, one sensing circuit (640, 650, 660) may be provided per subpixel 800. In one embodiment, each interconnected sets of transistors (640, 650, 660) of the sensing circuit may be arranged side by side within an area of a respective strip located in proximity to an edge of the unit cell UC and extending along the entire length of a side of the unit cell UC or along at least 30% of the length of the side of the unit cell UC. In another embodiment, each interconnected sets of transistors (640, 650, 660) of the sensing circuit may be arranged around the floating diffusion region 608 of the transfer transistor 630 within an area of a block located in proximity to a corner of the unit cell UC.

According to an embodiment of the present disclosure, a plurality of photovoltaic junctions may be formed for a subpixel 800 in a semiconductor substrate 500 by doping portions of the semiconductor substrate 500. Each of the plurality of photovoltaic junctions comprises a respective first-conductivity-type pinning layer 603 and a respective second-conductivity-type pillar structure 606, and may include a respective source second-conductivity-type photodiode layer 602. A sensing circuit (640, 650, 660) may be formed on a front surface of the semiconductor substrate 500 for each subpixel 800.

FIGS. 3A-3D illustrate various configurations of an image pixel 900 at the level of the second-conductivity-type pillar structures 606.

Figure 3A:
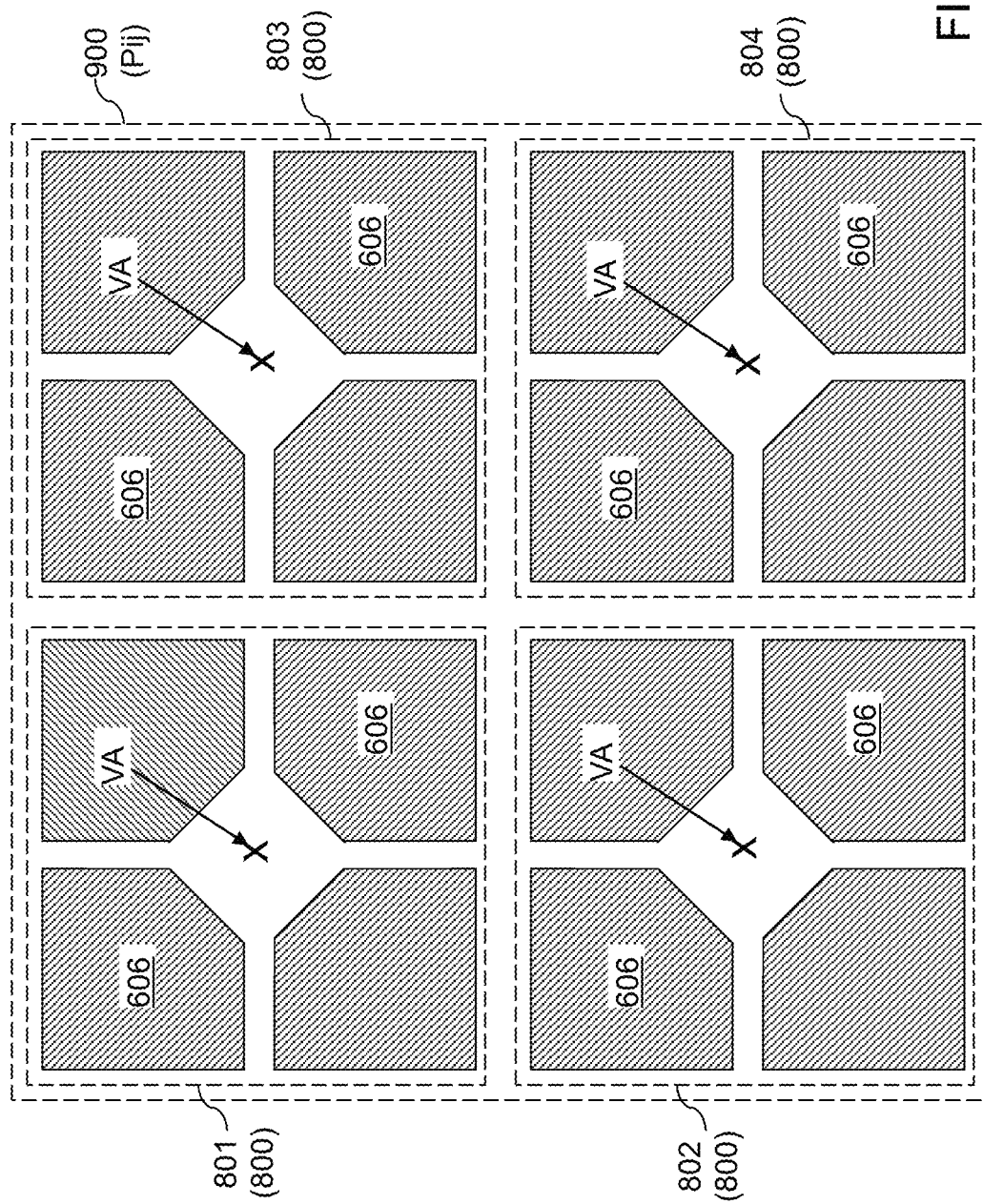

Referring to FIG. 3A, a first configuration of an image pixel 900 is illustrated. Each image pixel 900 may include one or more subpixels 800. In one embodiment, each image pixel 900 may include a first subpixel 801, a second subpixel 802, a third subpixel 803, and a fourth subpixel 804. In a non-limiting illustrative example, the first subpixel 801 may be a red image pixel configured to detect light within the wavelength range from 635 nm to 700 nm, the second subpixel 802 and the third subpixel may be green image pixels configured to detect light within the wavelength range from 520 nm to 560 nm, and the fourth subpixel 804 may be a blue image pixel configured to detect light within the wavelength range from 450 nm to 490 nm.

According to an embodiment of the present disclosure, each subpixel 800 may include a plurality of second-conductivity-type pillar structures 606. The plurality of second-conductivity-type pillar structures 606 may be arranged around a vertical axis VA passing through the geometrical center of the plurality of second-conductivity-type pillar structures 606 within each subpixel 800. According to an embodiment of the present disclosure, each vertical axis VA may be located between the second-conductivity-type pillar structures 606, and may not intersect the second-conductivity-type pillar structures 606. The second-conductivity-type pillar structures 606 may have vertical sidewalls. In one embodiment, four second-conductivity-type pillar structures 606 may be provided per subpixel 800, and each of the second-conductivity-type pillar structures 606 may have a pentagonal horizontal cross-sectional shape that is derived by cutting a corner of a respective rectangular shape. The side that corresponds to the cut corner of a rectangle may face, and may be proximal to, the vertical axis VA that passes through the geometrical center of the second-conductivity-type pillar structures 606 of the subpixel 800. The geometrical center of the second-conductivity-type pillar structures 606 of the subpixel 800 is the location of the center of gravity of the second-conductivity-type pillar structures 606 of the subpixel 800, and may be located between the volumes of the second-conductivity-type pillar structures 606 of the subpixel 800.

Figure 3B:
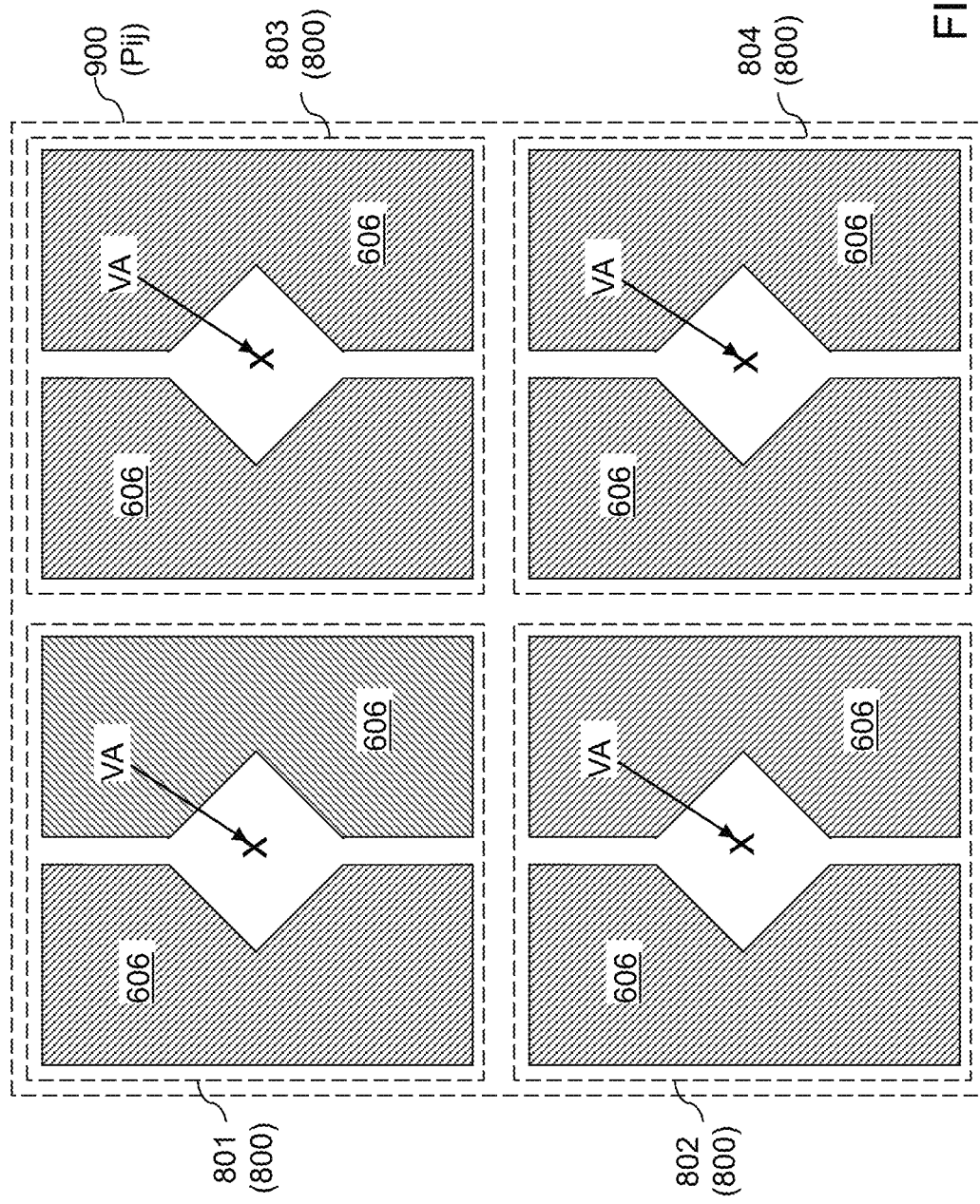

Referring to FIG. 3B, a second configuration of an image pixel 900 is illustrated. The second configuration of the image pixel 900 may be derived from the first configuration of the image pixel 900 of FIG. 3A by merging neighboring pairs of second-conductivity-type pillar structures 606 of each subpixel 800 into a single second-conductivity-type pillar structure 606. In this embodiment, each subpixel 800 may include two second-conductivity-type pillar structures 606. The geometrical center of the second-conductivity-type pillar structures 606 of the subpixel 800 is the location of the center of gravity of the second-conductivity-type pillar structures 606 of the subpixel 800, and may be located between the volumes of the second-conductivity-type pillar structures 606 of the subpixel 800.

Figure 3C:
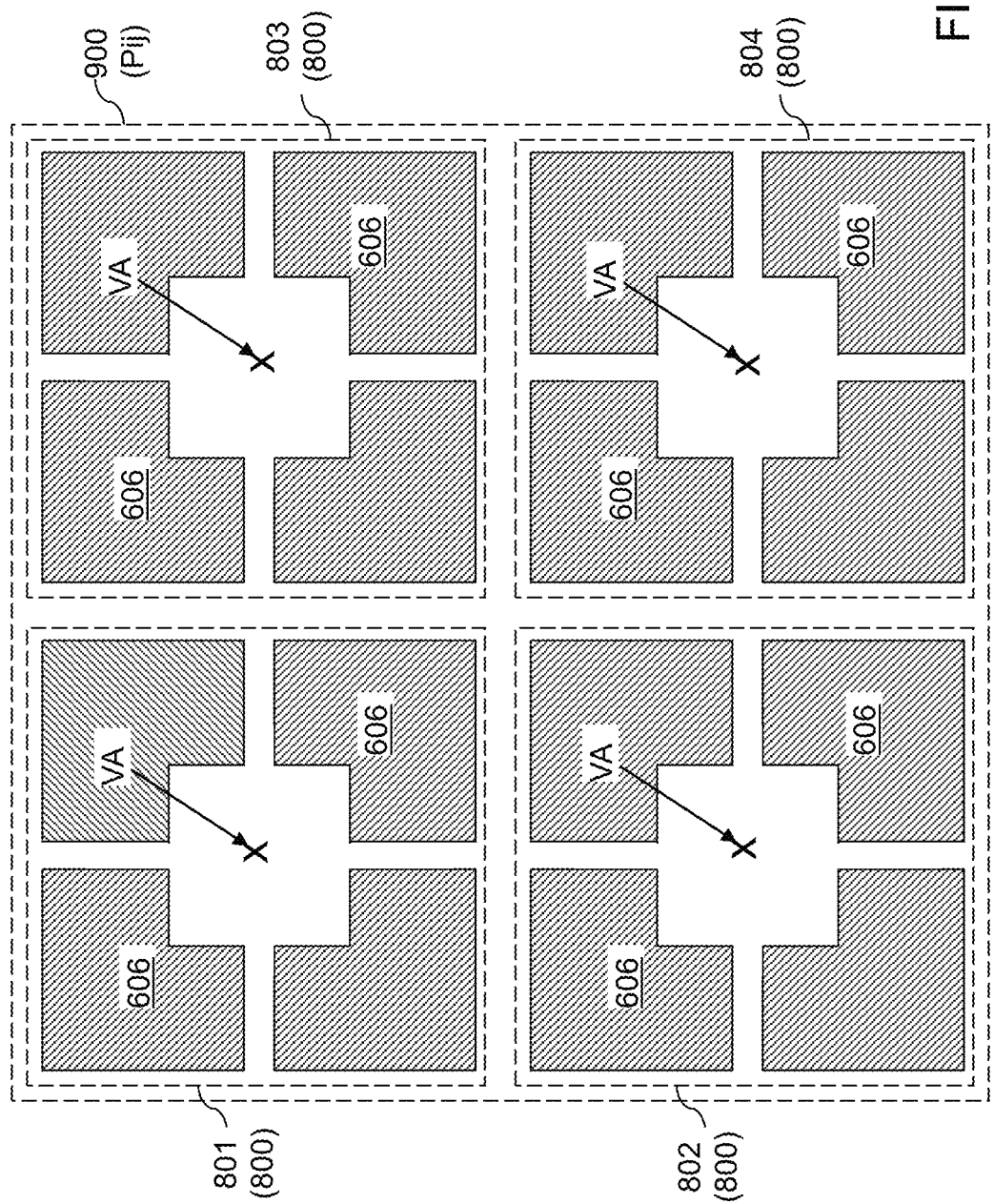

Referring to FIG. 3C, a third configuration of an image pixel 900 is illustrated. The third configuration of the image pixel 900 may be derived from the first configuration of the image pixel 900 of FIG. 3A by changing the shape of a cut at a corner of a rectangular horizontal shape. For example, the shape of each cut may have two sides, and a region having a generally rectangular horizontal cross-sectional shape may be formed around the vertical axis VA that passes through the geometrical center of the second-conductivity-type pillar structures 606 of each subpixel 800.

Referring to FIG. 3D, a fourth configuration of an image pixel 900 is illustrated. The fourth configuration of the image pixel 900 may be derived from the first configuration of the image pixel by not cutting corner portions of the second-conductivity-type pillar structures 606 of each subpixel 800 around the vertical axis VA that passes through the geometrical center of the second-conductivity-type pillar structures 606 of each subpixel 800. In this embodiment, each second-conductivity-type pillar structure 606 may have a respective rectangular horizontal shape.

Generally, a plurality of second-conductivity-type pillar structures 606 may be provided within each subpixel 800, and a region that is not a portion of the plurality of second-conductivity-type pillar structures 606 may be provided at, and around, a vertical axis VA that passes through the geometrical center of the plurality of second-conductivity-type pillar structures 606. The volume of each subpixel 800 that is laterally surrounded by the plurality of second-conductivity-type pillar structures 606 may be occupied by the substrate semiconductor layer 601. The focal point of an optical lens to be subsequently formed may be at a point within the vertical axis VA for each subpixel 800. While four configurations of the image pixel 900 are illustrated in the present disclosure, it is understood that the plurality of second-conductivity-type pillar structures 606 within each subpixel 800 may have various geometrical shapes. Each second-conductivity-type pillar structure 606 may be laterally confined by a respective set of vertical sidewalls, and a portion of the substrate semiconductor layer 601 that is laterally surrounded by the plurality of second-conductivity-type pillar structures 606 may be located around the vertical axis VA that passes through the geometrical center of the plurality of second-conductivity-type pillar structures 606 of the subpixel 800.

Figure 4:
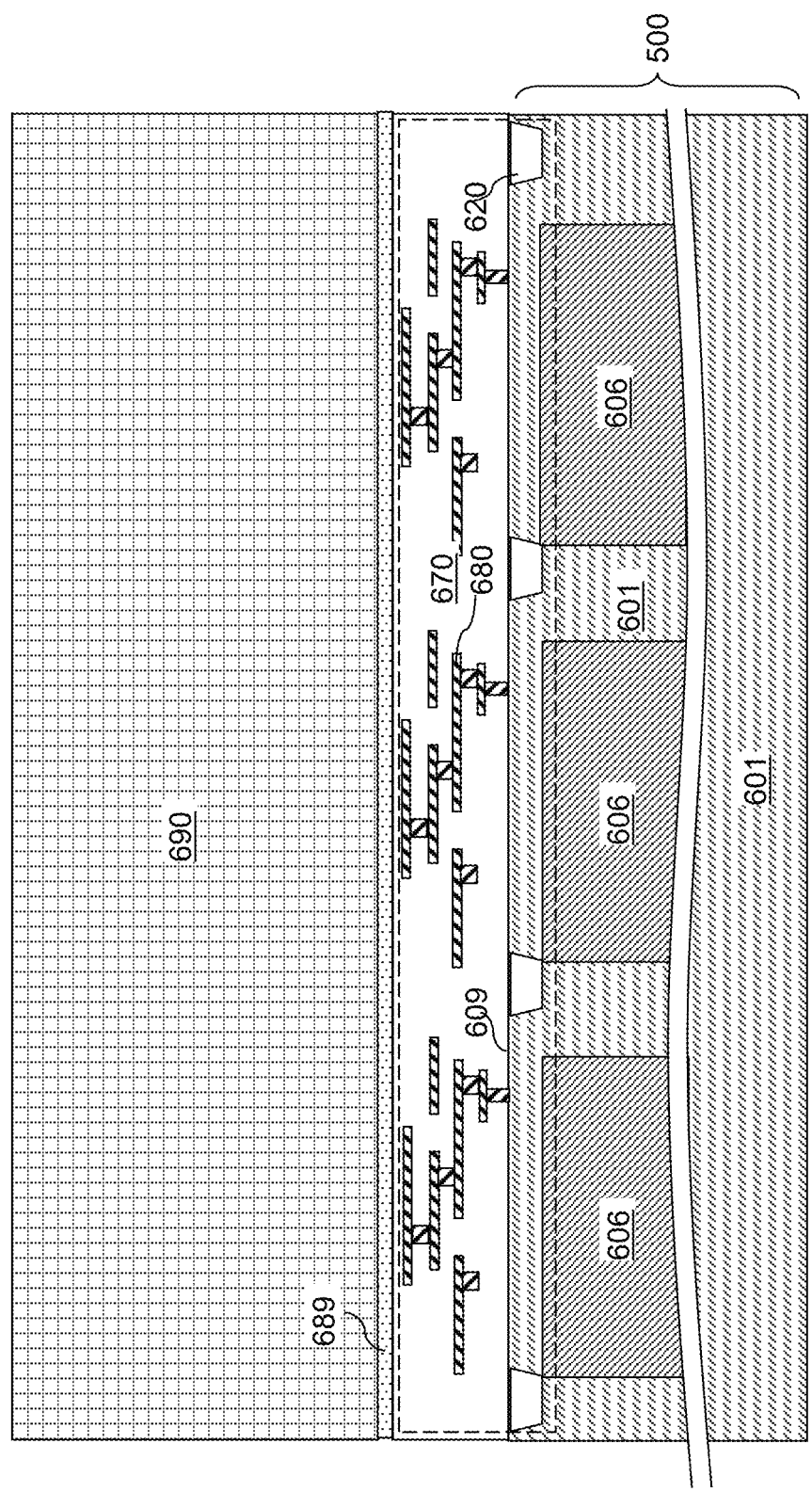
FIG. 4 is a vertical cross-sectional view of the exemplary structure after formation of metal interconnect structures formed within interconnection-level dielectric layers and attachment of a carrier substrate according to an embodiment of the present disclosure.

FIG. 4 is a vertical cross-sectional view of the exemplary structure after formation of metal interconnect structures formed within interconnection-level dielectric layers and attachment of a carrier substrate according to an embodiment of the present disclosure. Referring to FIG. 4, additional interconnect-level dielectric layers 670 and additional metal interconnect structures 680 may be formed on the front side of the semiconductor substrate 500. The front side of the assembly of the semiconductor substrate 500, the interconnect-level dielectric layers 670, and the structures formed therein may be bonded to a carrier substrate 690. The carrier substrate 690 may be temporarily attached to the assembly of the semiconductor substrate 500 and the interconnect-level dielectric layers 670 to provide subsequent thinning of the semiconductor substrate 500, and to provide subsequent handling of the assembly of a thinned semiconductor substrate 510 and the interconnect-level dielectric layers 670. The carrier substrate 690 may include a semiconductor material, an insulating material, or a metallic material, and may have a thickness in a range from 300 microns to 1 mm, although lesser and greater thicknesses may also be used.

Any suitable bonding method may be used to bond the carrier substrate 690 to the front side of the interconnect-level dielectric layers 670. Exemplary bonding methods that may be used to bond the carrier substrate 690 to the interconnect-level dielectric layers 670 include, but are not limited to, oxide-to-oxide bonding, oxide-to-semiconductor bonding, fusion bonding, hybrid bonding, anodic bonding, direct bonding, other suitable bonding processes, and/or combinations thereof. Optionally, a bonding buffer layer 689 including an intermediate bonding material (e.g., silicon oxide, silicon nitride, or a semiconductor material) may be used to provide bonding between the interconnection-level dielectric layers 670 and the carrier substrate 690.

Figure 5:
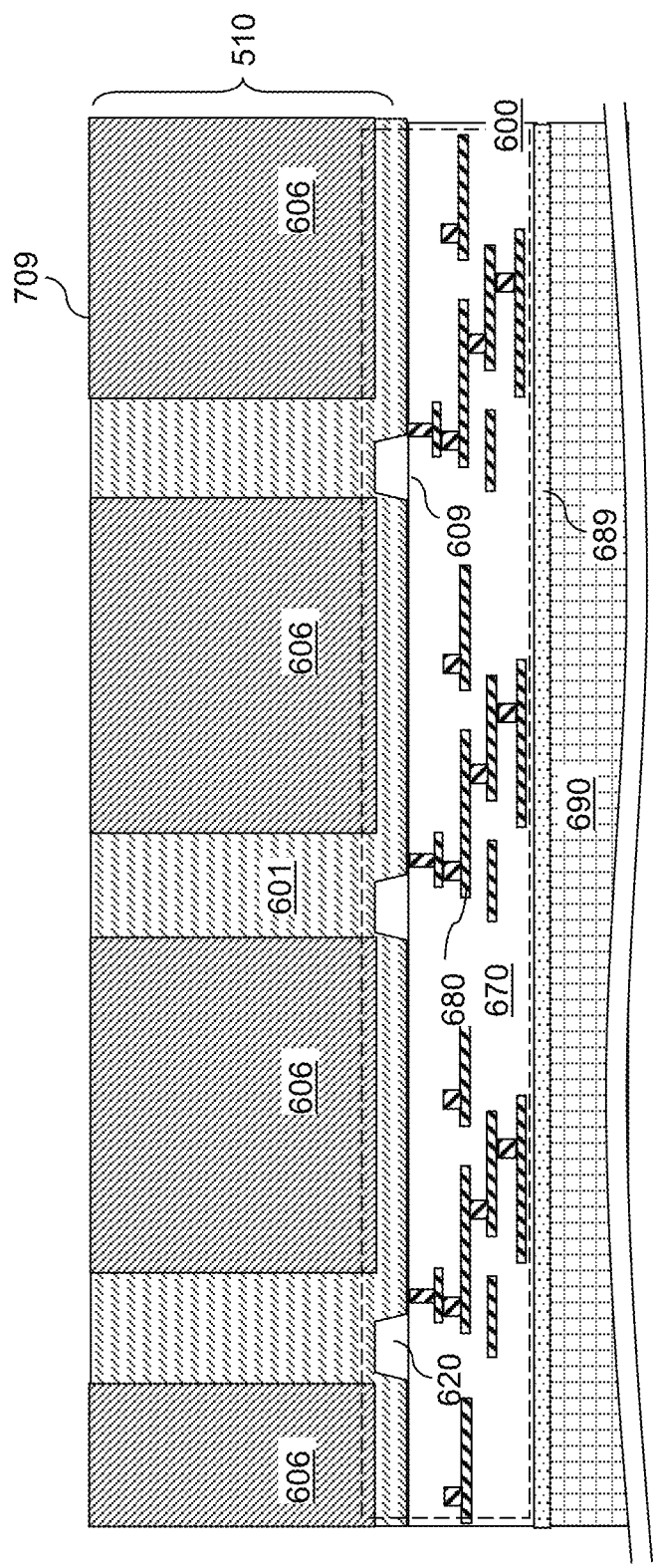
FIG. 5 is a vertical cross-sectional view of the exemplary structure after thinning a semiconductor substrate according to an embodiment of the present disclosure.

FIG. 5 is a vertical cross-sectional view of the exemplary structure after thinning a semiconductor substrate according to an embodiment of the present disclosure. Referring to FIG. 5, the backside of the semiconductor substrate 500 may be thinned, for example, by grinding, polishing, an isotropic etch process, and/or an anisotropic etch process. The carrier substrate 690 may provide mechanical support to the semiconductor substrate 500 during the thinning process. Bottom surfaces of the second-conductivity-type pillar structures 606 are physically exposed by thinning the backside of the semiconductor substrate 500.

In one embodiment, the semiconductor substrate 500 may be thinned to a thickness in a range from 1 micron to 12 microns, such as from 1.5 microns to 8 microns. The semiconductor substrate 500 as thinned after the thinning process is herein referred to as a thinned semiconductor substrate 510, or as a semiconductor substrate 510. Generally, the backside surface 709 of a thinned semiconductor substrate 510 may be physically exposed. The thickness of the thinned semiconductor substrate 510 may be determined by the maximum depth of deep trenches to be subsequently formed on the backside of the thinned semiconductor substrate 510. In one embodiment, the thickness of the thinned semiconductor substrate 510 may be selected such that deep trenches to be subsequently formed on the backside of the semiconductor substrate 510 reaches proximal surfaces of the shallow trench isolation structures 620. The backside surface 709 of the thinned semiconductor substrate 510 may be polished to provide a planar horizontal surface that is parallel to the front surface 609 of the thinned semiconductor substrate 510. The exemplary structure may be subsequently flipped upside down for further processing.

Figure 6B:
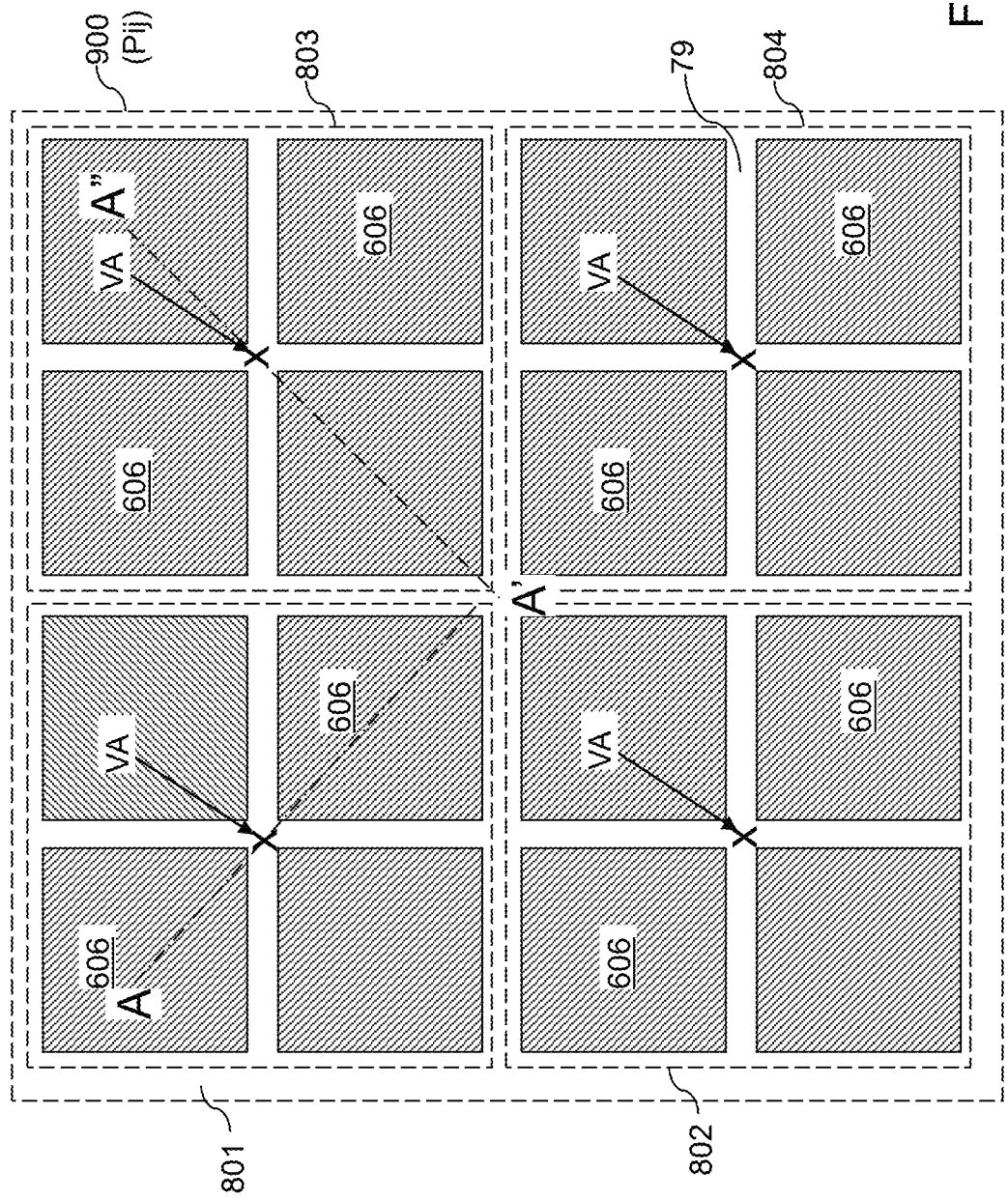
FIG. 6B is a top-down view of the image pixel of FIG. 6A. The hinged vertical plane A-A'-A" corresponds to the plane of the vertical cross-sectional view of FIG. 6A that includes the vertical axes A, A', and A".

FIG. 6A is a vertical cross-sectional view of a region of an image pixel after formation of deep trenches according to an embodiment of the present disclosure. Vertical axes A, A', and A" are illustrated. FIG. 6B is a top-down view of the image pixel of FIG. 6A. The hinged vertical plane A-A'-A" corresponds to the plane of the vertical cross-sectional view of FIG. 6A that includes the vertical axes A, A', and A". Referring to FIGS. 6A and 6B and according to a first embodiment of the present disclosure, a photoresist layer (not shown) may be applied over the backside surface 709 of the thinned semiconductor substrate 510, and may be lithographically patterned to form openings that laterally surround the areas of the second-conductivity-type pillar structures 606. In one embodiment, the pattern of the openings in the photoresist layer may be the complement of the pattern of the second-conductivity-type pillar structures 606.

Unmasked portions of the semiconductor substrate 510 may be etched by performing an anisotropic etch process, which transfers the pattern of the openings in the photoresist layer into the semiconductor substrate 510. Interconnected deep trenches 79 may be formed by etching portions of the thinned semiconductor substrate 510 from the backside in areas that surround the second-conductivity-type pillar structures 606. Vertical sidewalls of the second-conductivity-type pillar structures 606 are physically exposed to the deep trenches 79. The depth of the deep trenches 79 may be in a range from 1 micron to 10 microns, such as from 1.5 microns to 8 microns. Deep trenches may be formed in the semiconductor substrate 510. The photoresist layer may be subsequently removed, for example, by ashing.

FIG. 7 is a vertical cross-sectional view of a region of an image pixel after formation of a deep trench isolation structure according to a first embodiment of the present disclosure. Referring to FIG. 7, at least one optically transparent dielectric material such as silicon oxide or a polymer material may be deposited in the deep trenches 79 and over the backside surface 709 of the thinned semiconductor substrate 510 to form a deep trench isolation structure 76. The deep trench isolation structure 76 may laterally surround each second-conductivity-type pillar structure 606 within a subpixel 800. In one embodiment, the deep trench isolation structure 76 may contact the bottom surfaces of the shallow trench isolation structures 620. The combination of the deep trench isolation structure 76 and the shallow trench isolation structures 620 may provide electrical isolation between each neighboring pair of photovoltaic junctions, between neighboring pairs of subpixels 800, and between neighboring pairs of image pixels 900.

Figure 8A:
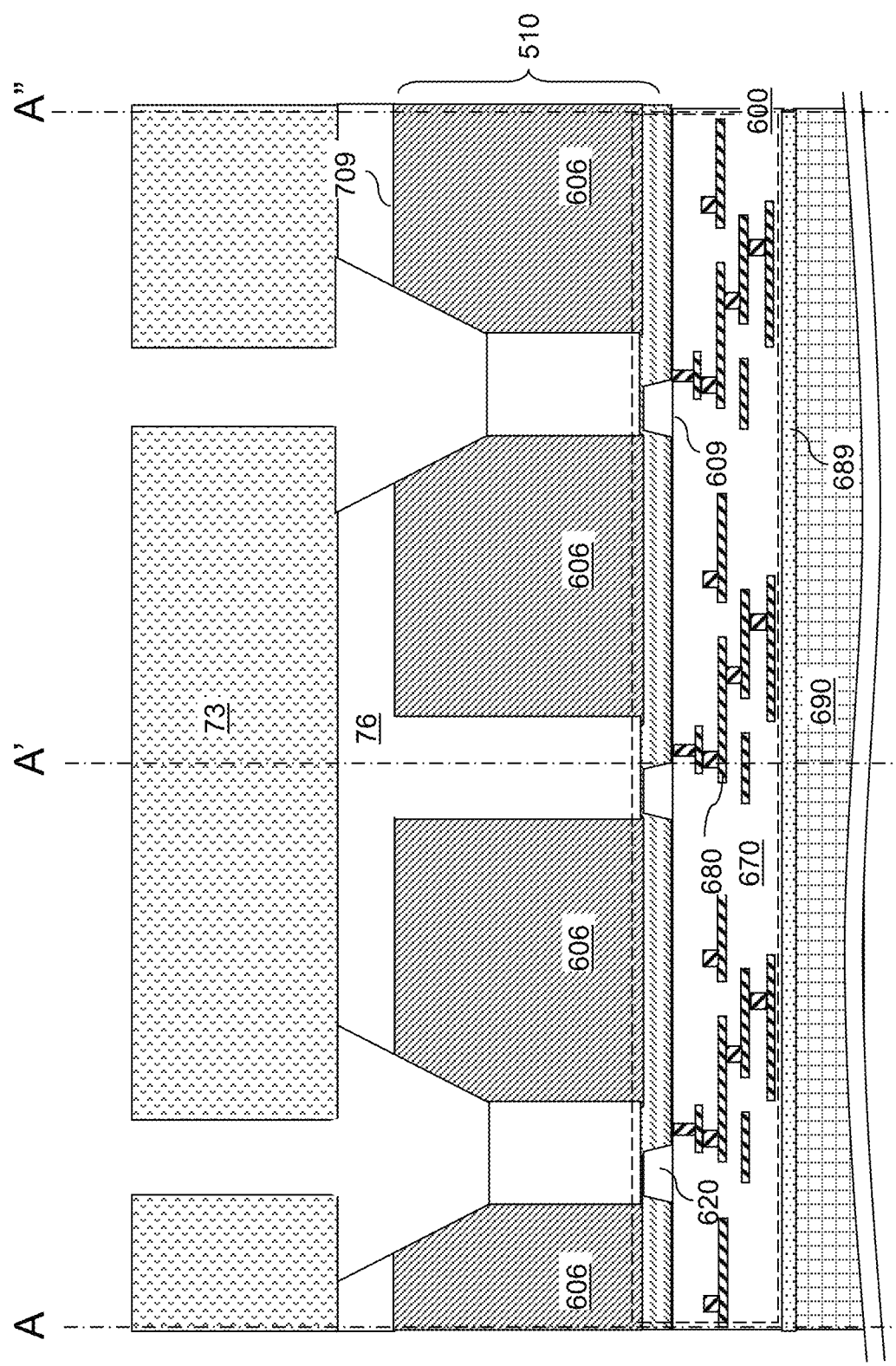
FIG. 8A is a vertical cross-sectional view of a region of an image pixel after formation of chamfer regions according to the first embodiment of the present disclosure. Vertical axes A, A', and A" are illustrated.

FIG. 8A is a vertical cross-sectional view of a region of an image pixel after formation of chamfer regions according to the first embodiment of the present disclosure. Vertical axes A, A', and A" are illustrated. FIG. 8B is a top-down view of the image pixel of FIG. 8A. The hinged vertical plane A-A'-A" corresponds to the plane of the vertical cross-sectional view of FIG. 8A that includes the vertical axes A, A', and A". Referring to FIGS. 8A and 8B, a photoresist layer 73 may be applied over the deep trench isolation structure 76, and may be lithographically patterned to form discrete openings centered at the vertical axes VA passing through the geometrical centers of the second-conductivity-type pillar structures 606 of each subpixel 800. In one embodiment, the shape of each discrete opening in the photoresist layer 73 overlying a respective subpixel 800 may replicate the shape of the outer boundaries of an underlying region of the substrate semiconductor layer 601 that is laterally surrounded by the second-conductivity-type pillar structures 606 of the subpixel 800. For example, if the underlying region of the substrate semiconductor layer 601 that is laterally surrounded by the second-conductivity-type pillar structures 606 of the subpixel 800 has a shape of a rhombus (i.e., a diamond shape), the shape of each discrete opening in the photoresist layer 73 may have a shape of a rhombus of the same size, of a larger size, or of a smaller size.

An etch process may be performed to etch underlying portions of the deep trench isolation structure 76 and the second-conductivity-type pillar structures 606. The etch process uses an isotropic etch process such as a wet etch process, and may optionally use an anisotropic etch process. The isotropic etch process may include at least one dry etch process (such as a chemical dry etch process) and/or at least one wet etch process. For example, in embodiments in which the deep trench isolation structure 76 includes silicon oxide, the isotropic etch process may include a first wet etch step using dilute hydrofluoric acid and a second wet etch step using hot trimethyl-2 hydroxyethyl ammonium hydroxide ("hot TMY"), tetramethyl ammonium hydroxide (TMAH), or potassium hydroxide. The first wet etch step may vertically and laterally recess proximal portions of the deep trench isolation structure 76, and the second wet etch step may vertically and laterally recess the semiconductor material of the second-conductivity-type pillar structures 606 around each opening in the photoresist layer 73. A recess cavity is formed within each volume formed by removal of proximal portions of the deep trench isolation structure 76 and the second-conductivity-type pillar structures 606. The recess cavities may be formed in regions that overlie the vertical axes VA passing through the geometrical center of the second-conductivity-type pillar structures 606 of a respective subpixel 800. The photoresist layer 73 may be removed, for example, by ashing.

Figure 9B:
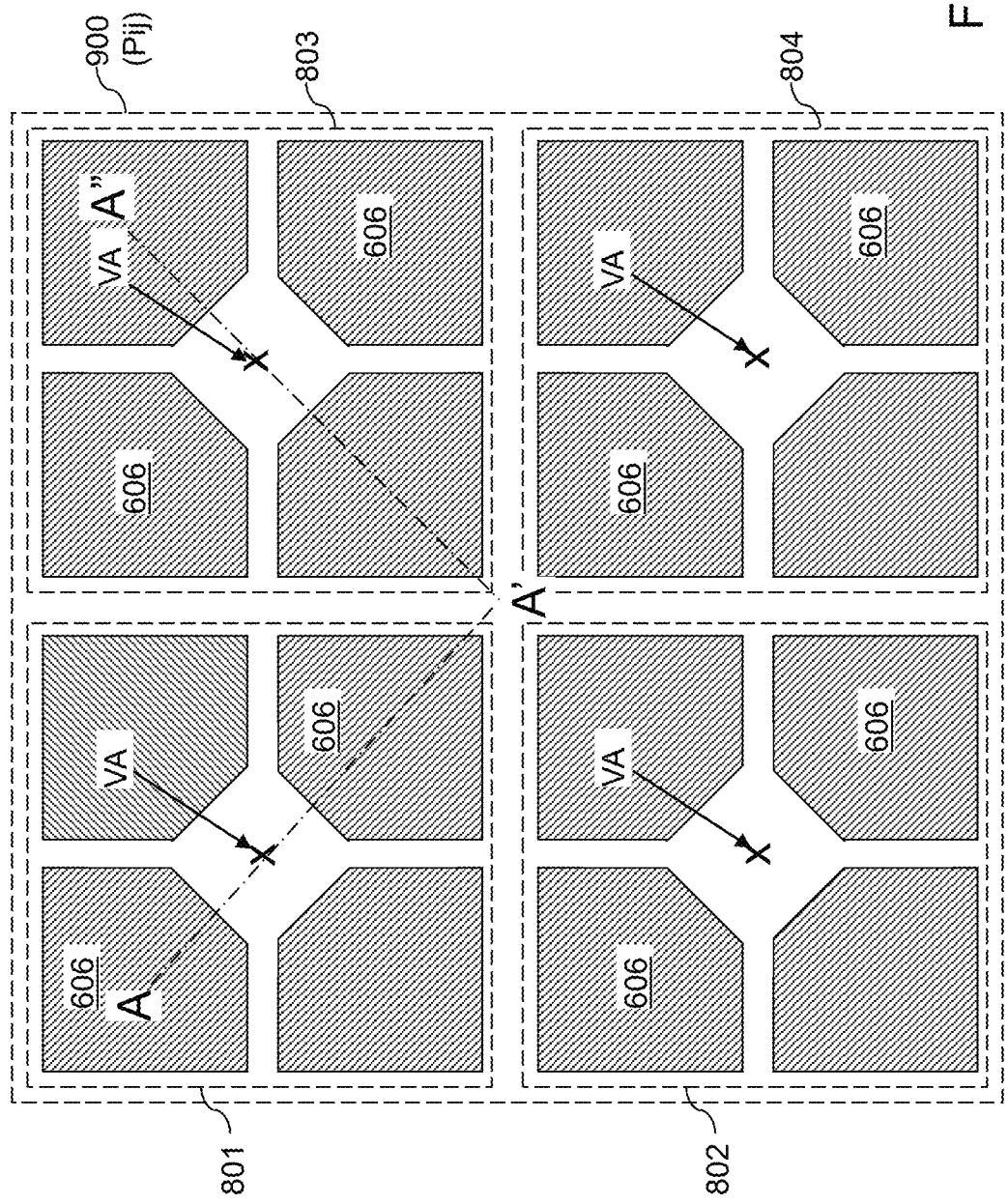
FIG. 9B is a top-down view of the image pixel of FIG. 9A. The hinged vertical plane A-A'-A" corresponds to the plane of the vertical cross-sectional view of FIG. 9A that includes the vertical axes A, A', and A".

FIG. 9A is a vertical cross-sectional view of a region of an image pixel after formation of a transparent dielectric material layer according to the first embodiment of the present disclosure. Vertical axes A, A', and A" are illustrated. FIG. 9B is a top-down view of the image pixel of FIG. 9A. The hinged vertical plane A-A'-A" corresponds to the plane of the vertical cross-sectional view of FIG. 9A that includes the vertical axes A, A', and A". Referring to FIGS. 9A and 9B, a transparent dielectric material layer 78L may be deposited in the recess cavities and over the horizontal top surface of the deep trench isolation structure 76. The transparent dielectric material layer 78L includes an optically transparent material. In one embodiment, the transparent dielectric material layer 78L may include a dielectric material having a higher refractive index than the refractive index of the material of the deep trench isolation structure 76. In one embodiment, the transparent dielectric material layer 78L may include silicon oxide, silicon nitride, or a dielectric metal oxide. The thickness of the transparent dielectric material layer 78L may be selected such that the entire volume of each recess cavity is filled.

Figure 10A:
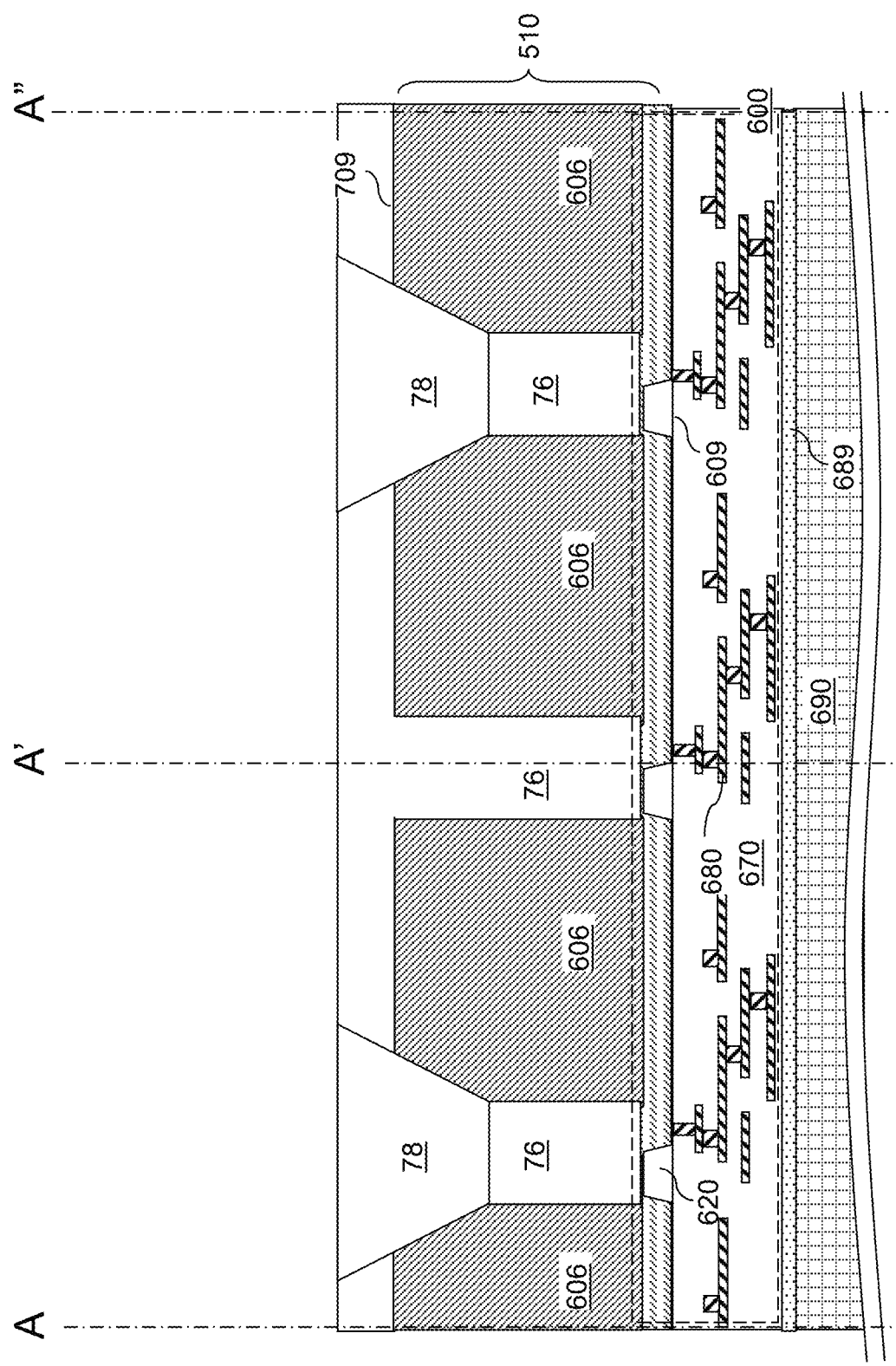
FIG. 10A is a vertical cross-sectional view of a region of an image pixel after formation of transparent refraction structures according to the first embodiment of the present disclosure. Vertical axes A, A', and A" are illustrated.
Figure 10B:
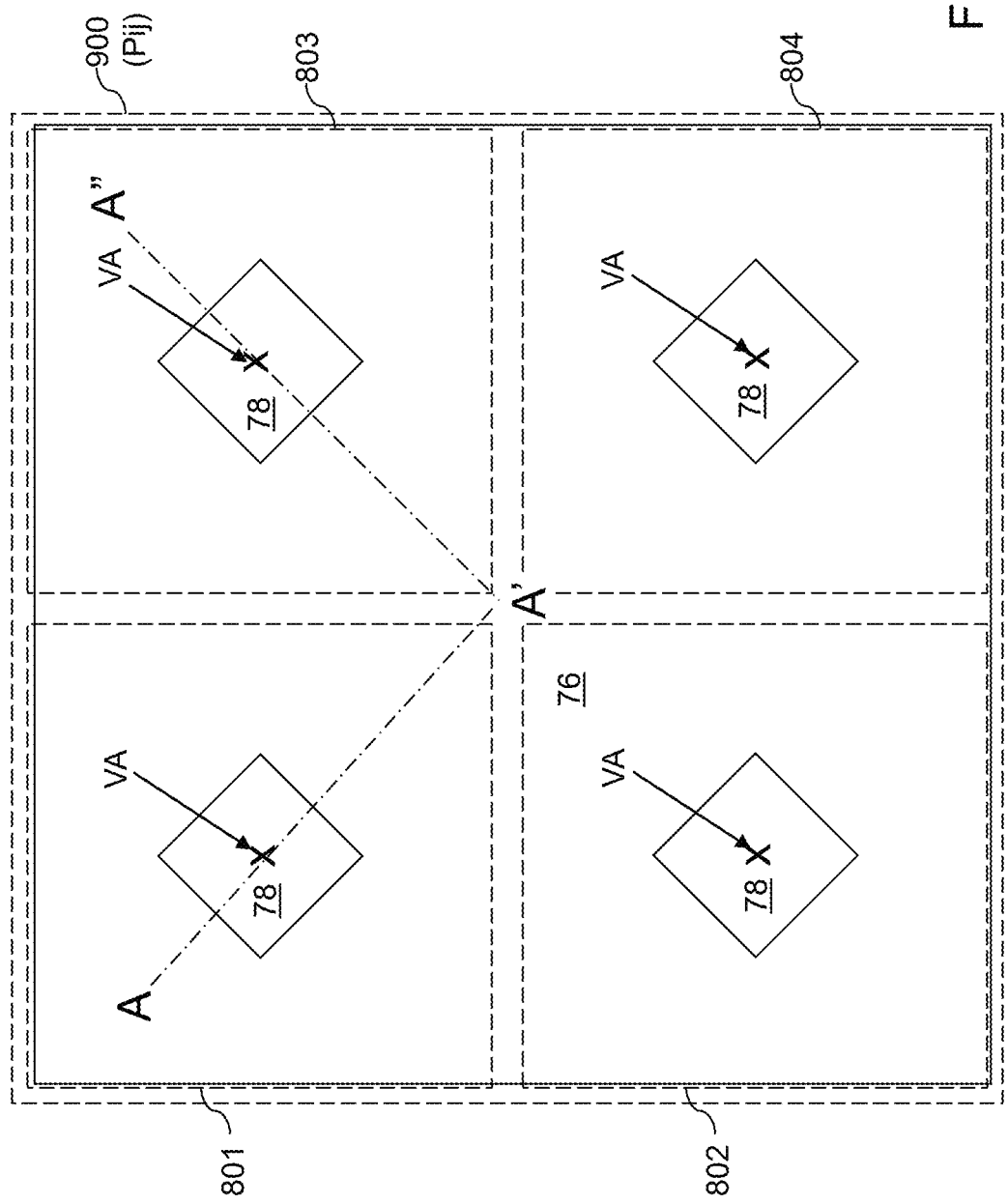
FIG. 10B is a top-down view of the image pixel of FIG. 10A. The hinged vertical plane A-A'-A" corresponds to the plane of the vertical cross-sectional view of FIG. 10A that includes the vertical axes A, A', and A".

FIG. 10A is a vertical cross-sectional view of a region of an image pixel after formation of transparent refraction structures according to the first embodiment of the present disclosure. Vertical axes A, A', and A" are illustrated. FIG. 10B is a top-down view of the image pixel of FIG. 10A. The hinged vertical plane A-A'-A" corresponds to the plane of the vertical cross-sectional view of FIG. 10A that includes the vertical axes A, A', and A". Referring to FIGS. 10A and 10B, a planarization process such as a chemical mechanical planarization (CMP) process may be performed to remove portions of the transparent dielectric material layer 78L from above the horizontal plane including the top surface of the deep trench isolation structure 76. Each remaining portion of the transparent dielectric material layer 78L comprises a transparent refraction structure 78. Each transparent refraction structure 78 may be formed on the backside surface 709 of the thinned semiconductor substrate 510. In one embodiment, each transparent refraction structure 78 may have a variable thickness that decreases with a lateral distance from a vertical axis VA passing through a geometrical center of the second-conductivity-type pillar structures 606 of a respective subpixel 800. Generally, the horizontal cross-sectional shape of each transparent refraction structure 78 may be the same as, or may be similar to, the shape of the boundary of an underlying portion of the substrate semiconductor layer 601 that is laterally bounded by a set of second-conductivity-type pillar structures 606 within a subpixel 800. For example, if the boundary of an underlying portion of the substrate semiconductor layer 601 that is laterally bounded by a set of second-conductivity-type pillar structures 606 within a subpixel 800 has a shape of a rhombus, an overlying transparent refraction structure 78 may have a horizontal cross-sectional shape of a rhombus.

Figure 11A:
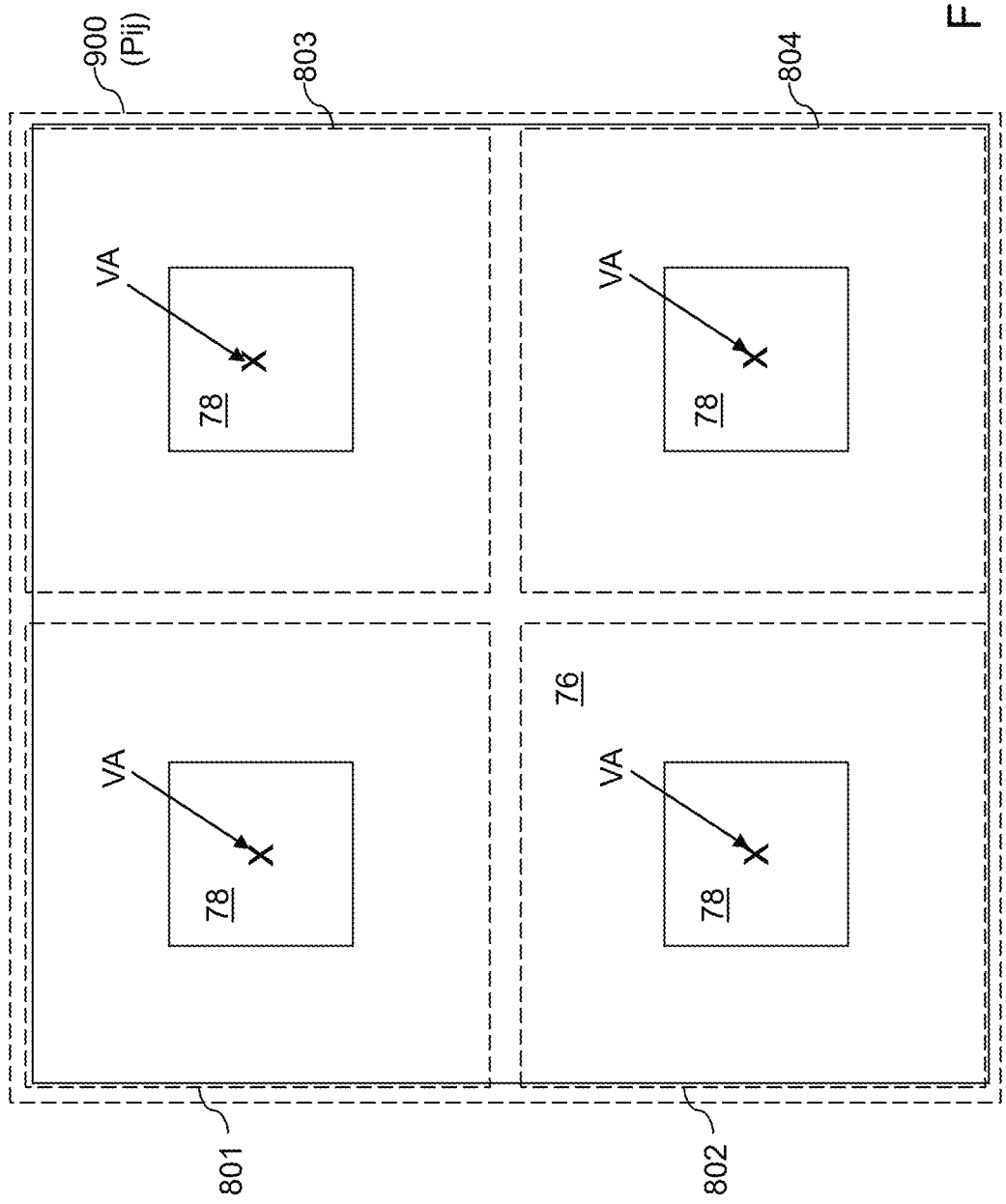
FIGS. 11A and 11B are top-down views of an image pixel in alternative configurations at a processing step corresponding to the processing steps of FIGS. 10A and 10B.
Figure 11B:
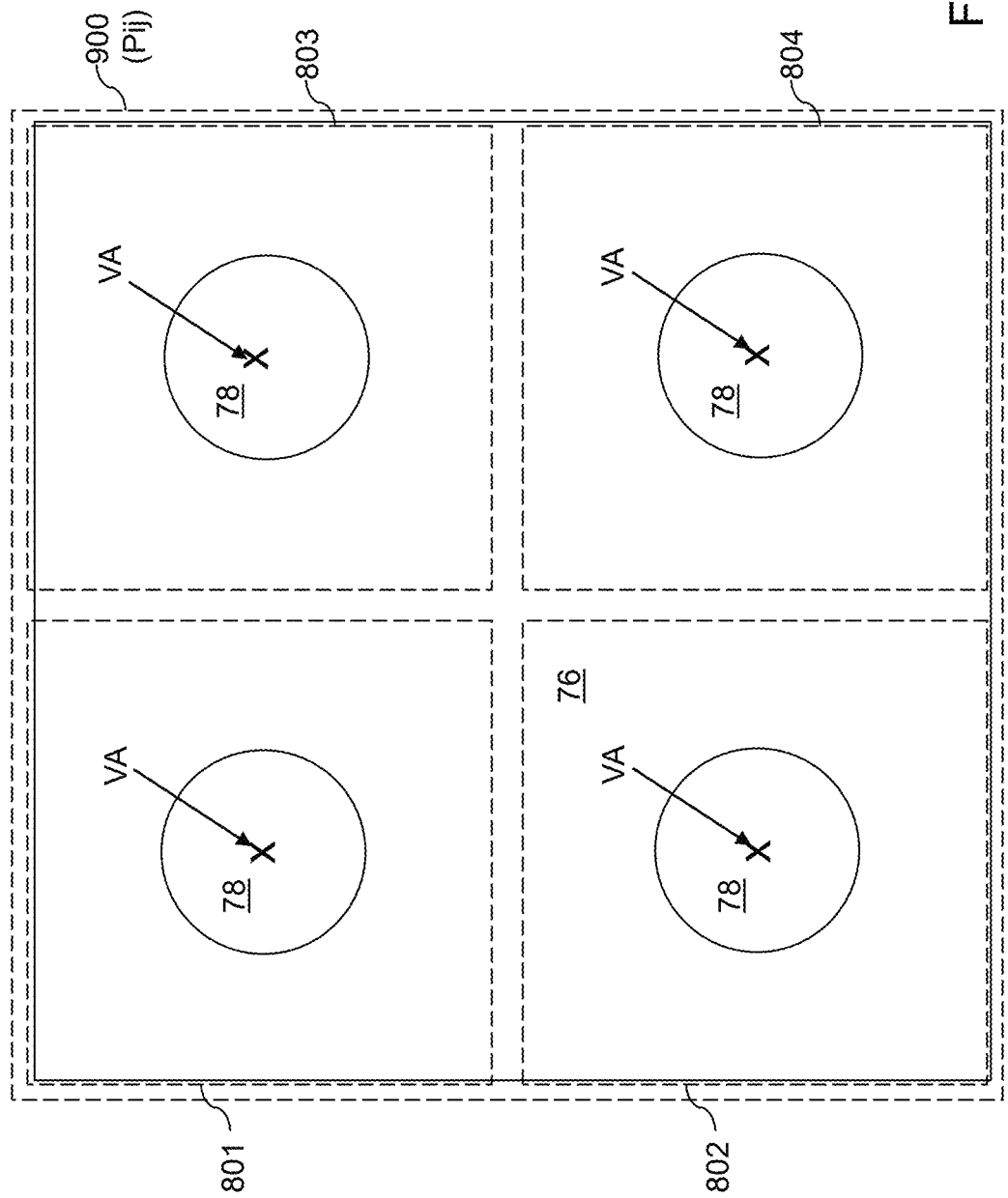

FIGS. 11A and 11B are top-down views of an image pixel in alternative configurations at a processing step corresponding to the processing steps of FIGS. 10A and 10B. Referring to FIG. 11A, an image pixel 900 in an alternative configuration is illustrated at a processing step corresponding to the processing steps of FIGS. 10A and 10B. In this alternative configuration, the transparent refraction structures 78 may have a respective horizontal cross-sectional shape of a rectangle having sides that are parallel to sidewalls of underlying second-conductivity-type pillar structures 606.

Referring to FIG. 11B, an image pixel 900 in another alternative configuration is illustrated at a processing step corresponding to the processing steps of FIGS. 10A and 10B. In this alternative configuration, the transparent refraction structures 78 may have a respective horizontal cross-sectional shape of a circle or an ellipse.

Generally, the horizontal cross-sectional shapes of the transparent refraction structures 78 may be modified by changing the shapes of the openings in the photoresist layer 73 at the processing steps of FIGS. 8A and 8B. Each transparent refraction structure 78 may have a rotational symmetry around the vertical axis VA that passes through the geometrical center of the underlying set of second-conductivity-type pillar structures 606 of the subpixel 800.

Figure 12A:
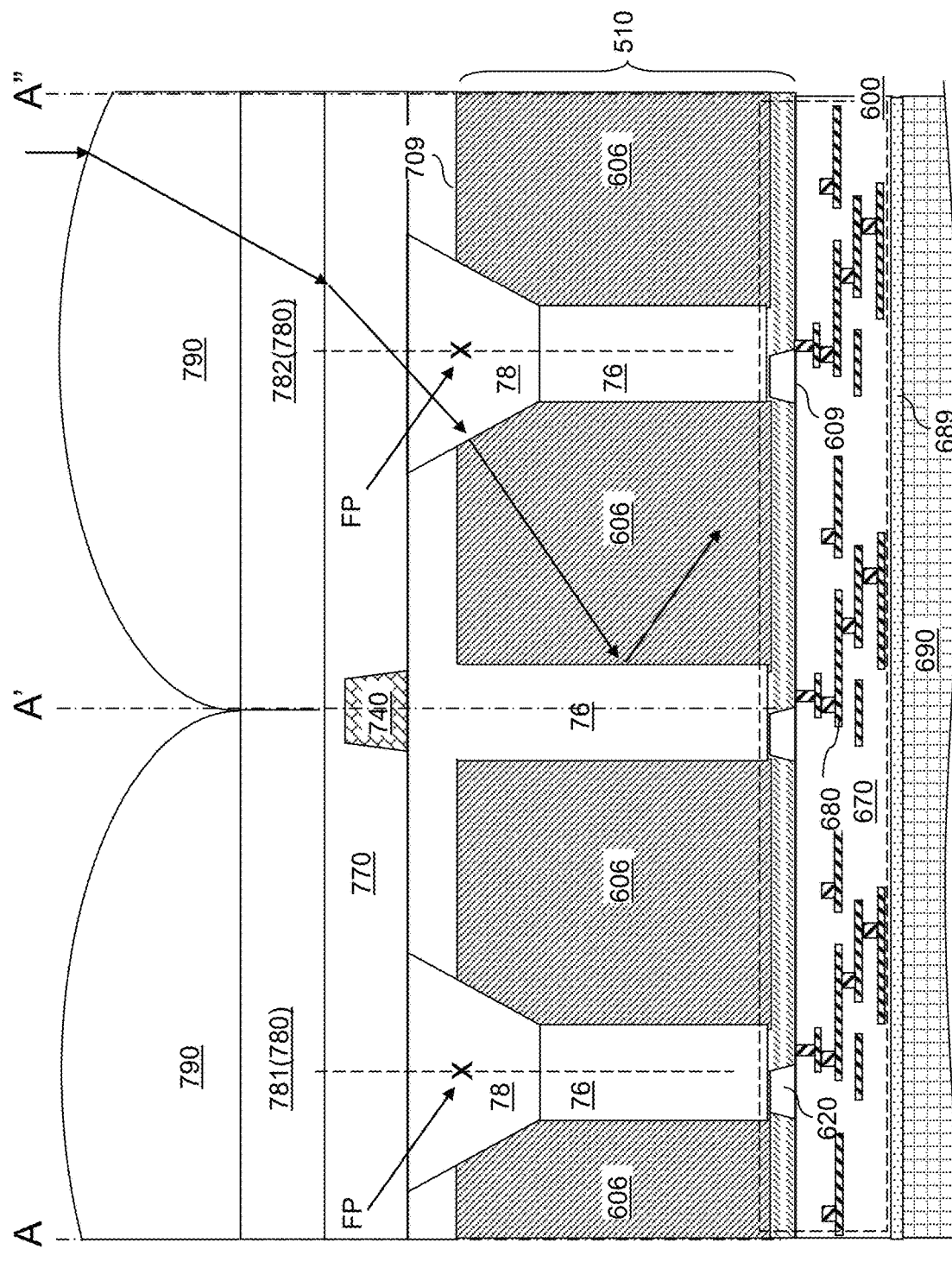
FIG. 12A is a vertical cross-sectional view of a region of an image pixel after formation of subpixel optics assemblies according to the first embodiment of the present disclosure. Vertical axes A, A', and A" are illustrated.
Figure 12B:
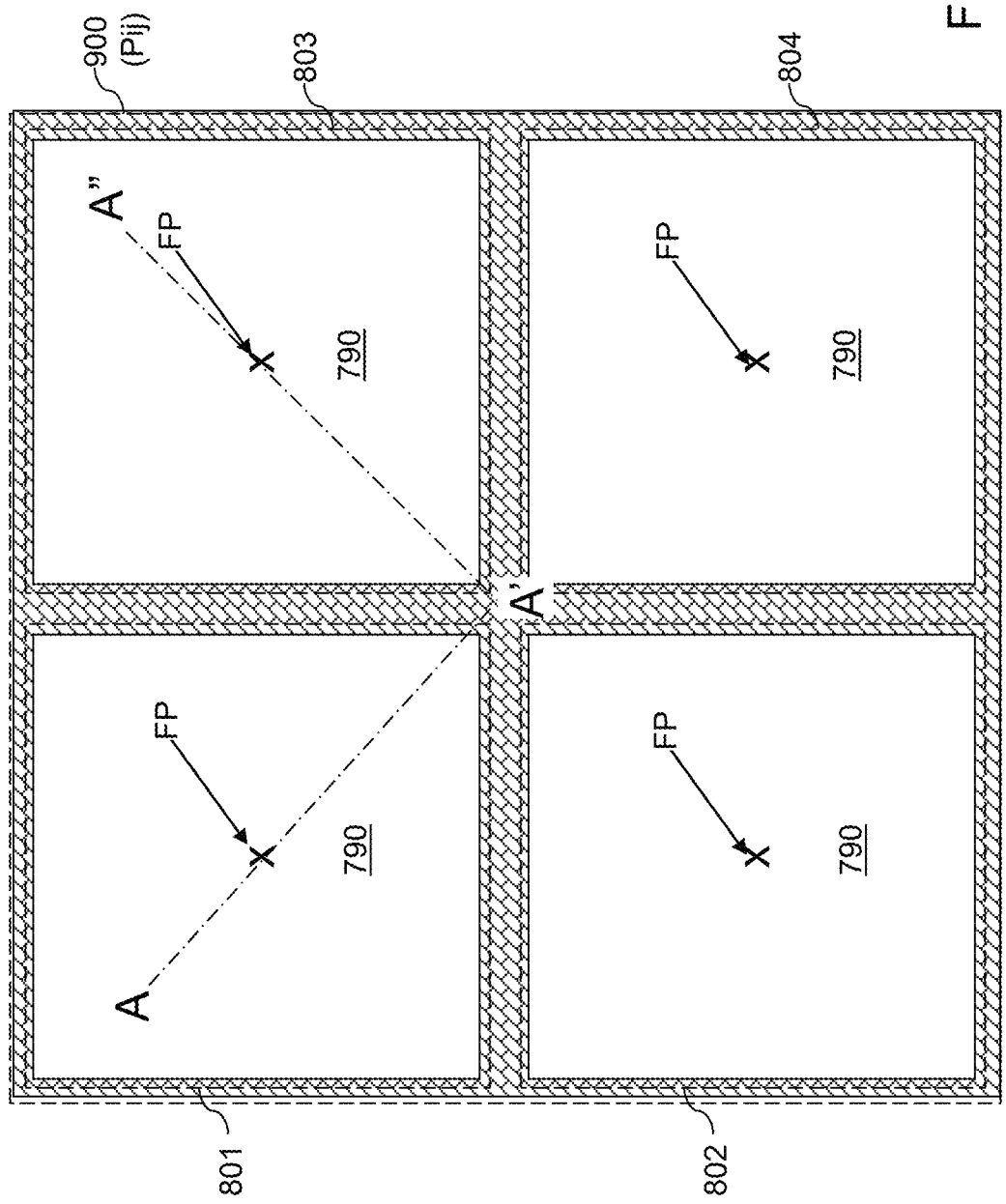
FIG. 12B is a top-down view of the image pixel of FIG. 12A. The hinged vertical plane A-A'-A" corresponds to the plane of the vertical cross-sectional view of FIG. 12A that includes the vertical axes A, A', and A".

FIG. 12A is a vertical cross-sectional view of a region of an image pixel after formation of subpixel optics assemblies according to the first embodiment of the present disclosure. Vertical axes A, A', and A" are illustrated. FIG. 12B is a top-down view of the image pixel of FIG. 12A. The hinged vertical plane A-A'-A" corresponds to the plane of the vertical cross-sectional view of FIG. 12A that includes the vertical axes A, A', and A". Referring to FIGS. 12A and 12B, a grid structure 740 including at least one optically reflective material may be formed around the periphery of each subpixel 800. The grid structure 740 may be formed by depositing and patterning at least one reflective material layer such as at least one metallic material layer.

An optically transparent layer 770 having a planar top surface may be formed over the grid structure 740. The optically transparent layer 770 may be formed by depositing a self-planarizing dielectric material such as flowable oxide (FOX). Alternatively, a transparent dielectric material may be deposited and planarized, for example, by chemical mechanical planarization to provide the optically transparent layer 770.

Various color filtering materials may be applied over the optically transparent layer 770, and may be patterned to form various color filters 780. The color filters 780 may include first-type color filters 781 (780) formed within the regions of the first subpixels 801, second-type color filters 782 (780) formed within the regions of the second subpixels 802, third-type color filters formed within the regions of the third subpixels 803, and fourth-type color filters formed within the regions of the fourth subpixels 804. The composition of each color filtering material may be selected such that light within a target wavelength ranges passes through the color filtering material, while light outside the target wavelength range is absorbed by the color filtering material.

Optical lenses 790 may be formed over the color filters 780 by applying an optically transparent material over the color filters 780 and by patterning the optically transparent material into material portions having convex surfaces that are centered on a respective one of the underlying openings within the grid structure 740.

Each combination of an optical lens 790, a color filter 780, and an underlying portion of the optically transparent layer 770 constitutes a subpixel optics assembly that is configured to filter and focus light onto a respective underlying set of photovoltaic junctions of a subpixel 800. Generally, a subpixel optics assembly (770, 780, 790) comprising an optical lens 790 may be formed over each transparent refraction structure 78. The subpixel optics assembly (770, 780, 790) in each subpixel 800 may be configured to direct incident light onto the plurality of photovoltaic junctions underneath. In one embodiment, the focal point FP of the subpixel optics assembly (770, 780, 790) in each subpixel 800 may be located on the vertical axis VA passing through the geometrical center of the set of second-conductivity-type pillar structures 606 of the subpixel 800.

Generally, the optical interfaces between each transparent refraction structure 78 and the second-conductivity-type pillar structures 606 within each subpixel 800 may be tapered, i.e., not vertical and not horizontal. The taper angle of the sidewalls of the transparent refraction structures 78 that contact the second-conductivity-type pillar structures 606 may be selected such that the angle of incidence of light impinging onto the sidewalls of the transparent refraction structures 78 have a smaller incidence angle than the angle of incidence onto any vertical surface or any horizontal surface. The angle of incidence is the angle between the direction of the incident light and the surface normal of a respective sidewall of a transparent refraction structure 78. Thus, a higher fraction of the incident light is refracted at the optical interfaces located at the sidewalls of the transparent refraction structures 78 due to the presence of the transparent refraction structures 78.

The carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Figure 13A:
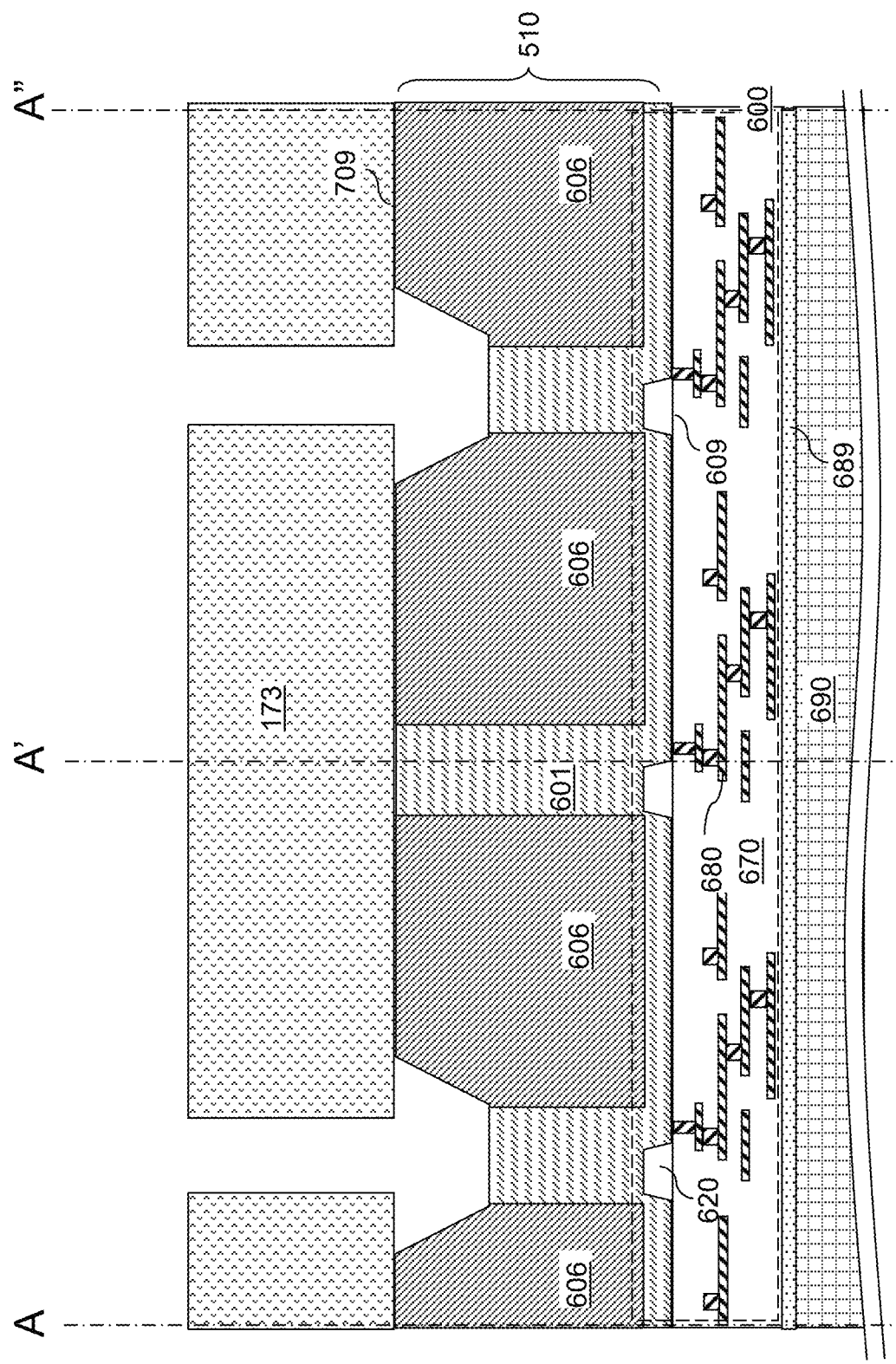
FIG. 13A is a vertical cross-sectional view of a region of an image pixel after formation of chamfer regions according to a second embodiment of the present disclosure. Vertical axes A, A', and A" are illustrated.
Figure 13B:
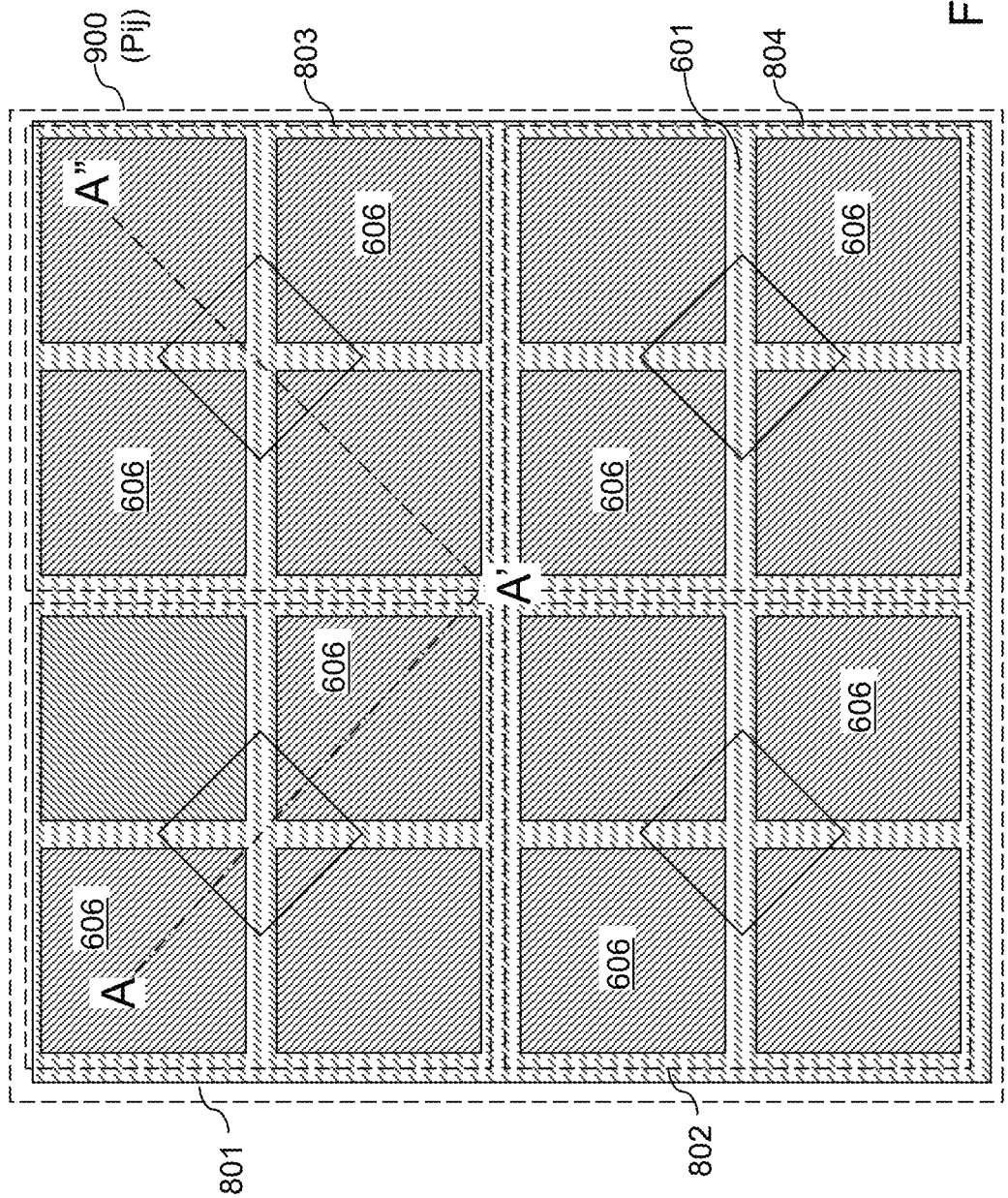
FIG. 13B is a top-down view of the image pixel of FIG. 13A. The hinged vertical plane A-A'-A" corresponds to the plane of the vertical cross-sectional view of FIG. 13A that includes the vertical axes A, A', and A".

FIG. 13A is a vertical cross-sectional view of a region of an image pixel after formation of chamfer regions according to a second embodiment of the present disclosure. Vertical axes A, A', and A" are illustrated. FIG. 13B is a top-down view of the image pixel of FIG. 13A. The hinged vertical plane A-A'-A" corresponds to the plane of the vertical cross-sectional view of FIG. 13A that includes the vertical axes A, A', and A". Referring to FIGS. 13A and 13B, a region of an image pixel 900 is illustrated after formation of chamfer regions according to a second embodiment of the present disclosure. The structure illustrated in FIGS. 13A and 13B may be derived from the structure of FIG. 5 by applying and lithographically patterning a photoresist layer 173 over the backside surface 709 of the thinned semiconductor substrate 510, and by performing an etch process using the photoresist layer 173 as an etch mask. The lithographic pattern in the photoresist layer 173 may be any of the patterns that may be used to pattern the photoresist layer 73 at the processing steps of FIGS. 8A and 8B.

The etch process etches underlying portions of the semiconductor material in the thinned semiconductor substrate 510. Specifically, portions of the substrate semiconductor layer 601 and the second-conductivity-type pillar structures 606 that are proximal to the openings in the photoresist layer 173 may be removed by the etch process. The etch process uses an isotropic etch process such as a wet etch process, and may optionally use an anisotropic etch process. The isotropic etch process may include at least one dry etch process (such as a chemical dry etch process) and/or at least one wet etch process. For example, the isotropic etch process may include wet etch step using hot trimethyl-2 hydroxyethyl ammonium hydroxide ("hot TMY"), tetramethyl ammonium hydroxide (TMAH), or potassium hydroxide. Depending on the etch chemistry, crystallographic facets may, or may not, be formed on the etched surfaces of the substrate semiconductor layer 601 and the second-conductivity-type pillar structures 606. A recess cavity is formed within each volume formed by removal of proximal portions of the substrate semiconductor layer 601 and the second-conductivity-type pillar structures 606. The recess cavities may be formed in regions that overlie the vertical axes VA passing through the geometrical center of the second-conductivity-type pillar structures 606 of a respective subpixel 800. The photoresist layer 173 may be removed, for example, by ashing.

Figure 14A:
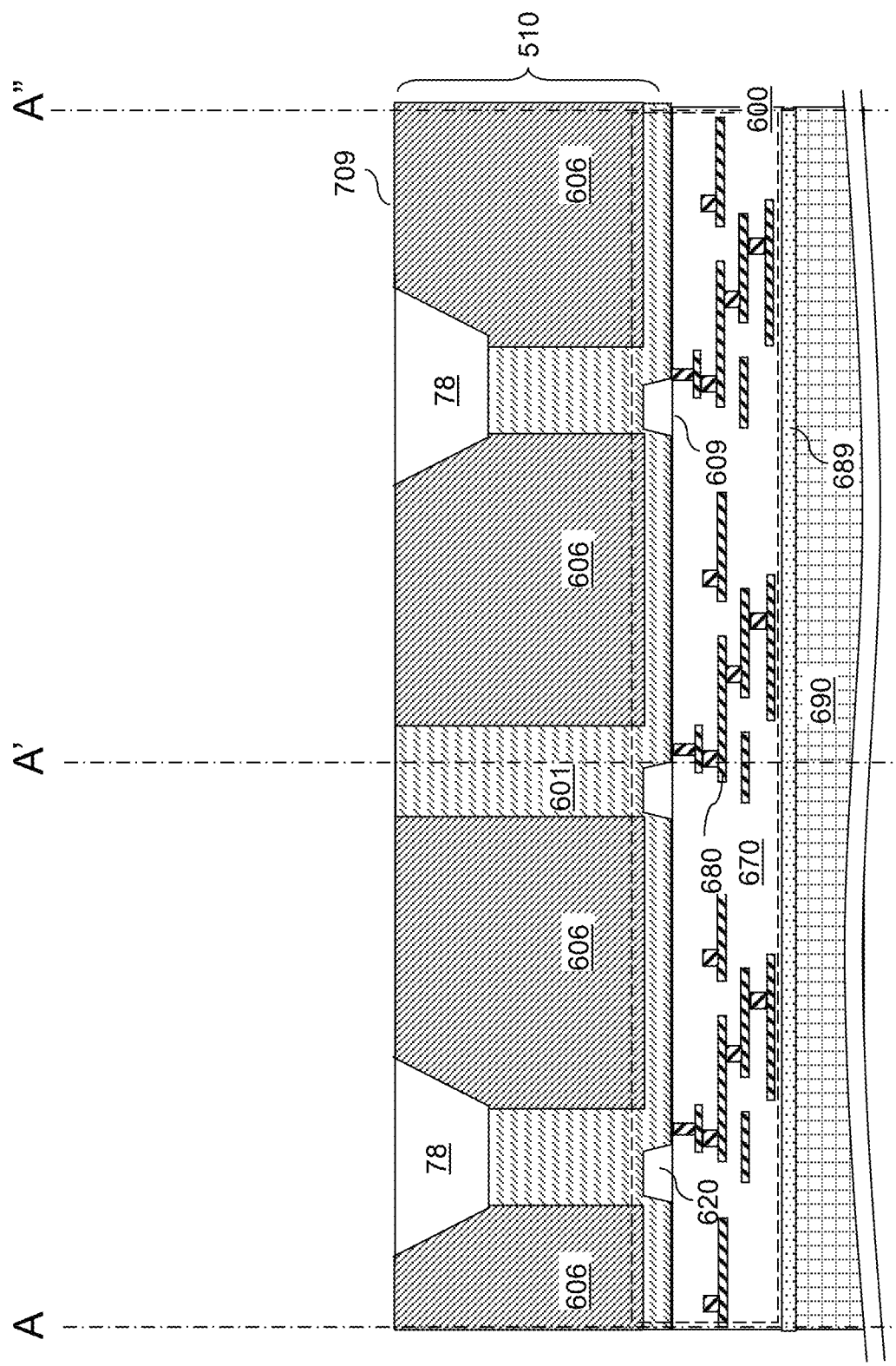
FIG. 14A is a vertical cross-sectional view of a region of an image pixel after formation of transparent refraction structures according to a second embodiment of the present disclosure. Vertical axes A, A', and A" are illustrated.
Figure 14B:
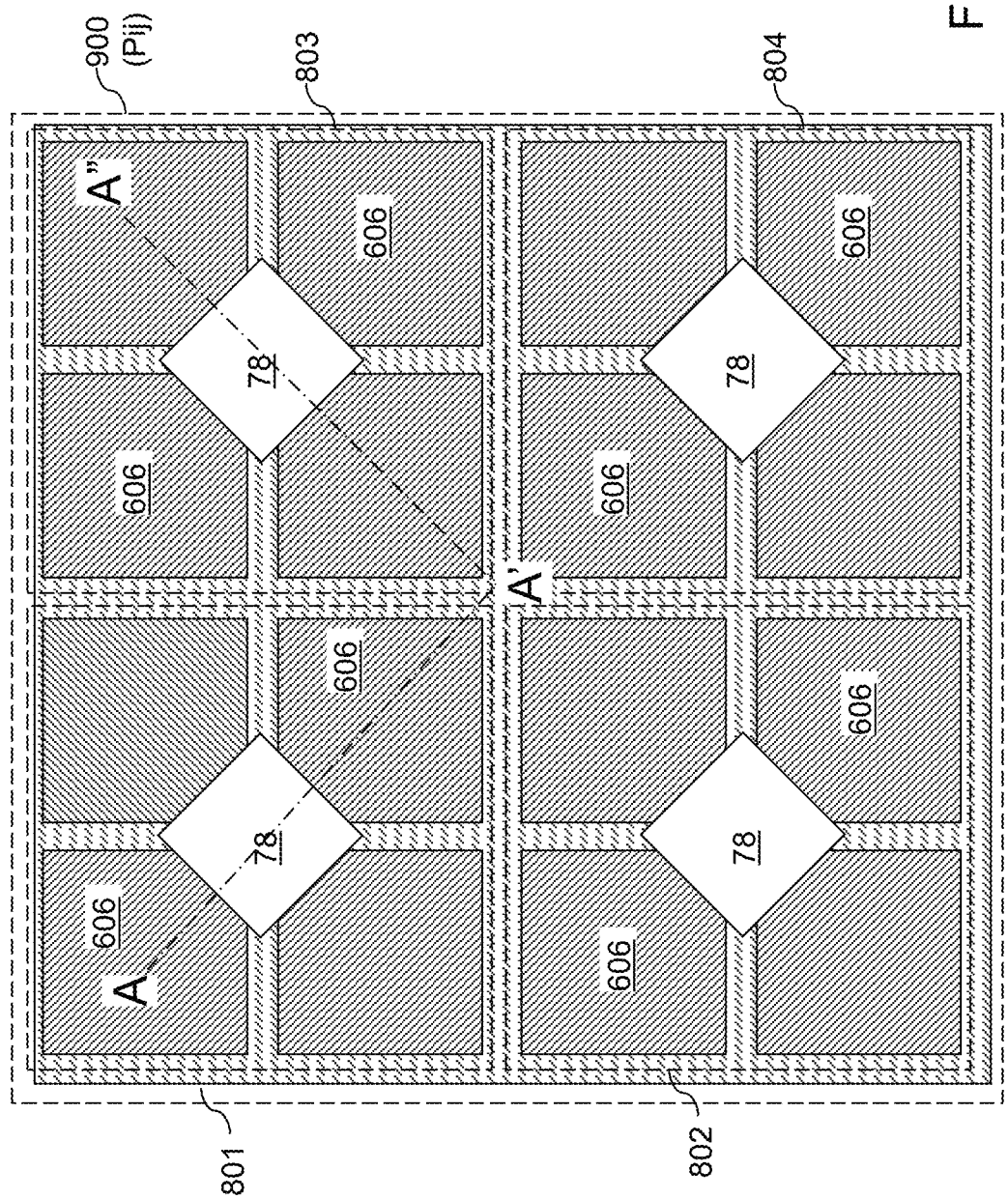
FIG. 14B is a top-down view of the image pixel of FIG. 14A. The hinged vertical plane A-A'-A" corresponds to the plane of the vertical cross-sectional view of FIG. 14A that includes the vertical axes A, A', and A".

FIG. 14A is a vertical cross-sectional view of a region of an image pixel after formation of transparent refraction structures according to a second embodiment of the present disclosure. Vertical axes A, A', and A" are illustrated. FIG. 14B is a top-down view of the image pixel of FIG. 14A. The hinged vertical plane A-A'-A" corresponds to the plane of the vertical cross-sectional view of FIG. 14A that includes the vertical axes A, A', and A". Referring to FIGS. 14A and 14B, a transparent dielectric material layer may be deposited in the recess cavities. The transparent dielectric material layer includes an optically transparent material. In one embodiment, the transparent dielectric material layer 78L may include a dielectric material having a higher refractive index than the refractive index of the material of a deep trench isolation structure to be subsequently formed. In one embodiment, the transparent dielectric material layer may include silicon oxide, silicon nitride oxide, or a dielectric metal oxide. The thickness of the transparent dielectric material layer may be selected such that the entire volume of each recess cavity is filled.

A planarization process such as a chemical mechanical planarization (CMP) process may be performed to remove portions of the transparent dielectric material layer from above the horizontal plane including the backside surface 709 of the thinned semiconductor substrate 510. Each remaining portion of the transparent dielectric material layer comprises a transparent refraction structure 78. Each transparent refraction structure 78 may be formed on the backside surface 709 of the thinned semiconductor substrate 510. In one embodiment, each transparent refraction structure 78 may have a variable thickness that decreases with a lateral distance from a vertical axis VA passing through a geometrical center of the second-conductivity-type pillar structures 606 of a respective subpixel 800. Generally, the horizontal cross-sectional shape of each transparent refraction structure 78 may be the same as, or may be similar to, the shape of the boundary of an underlying portion of the substrate semiconductor layer 601 that is laterally bounded by a set of second-conductivity-type pillar structures 606 within a subpixel 800. For example, if the boundary of an underlying portion of the substrate semiconductor layer 601 that is laterally bounded by a set of second-conductivity-type pillar structures 606 within a subpixel 800 has a shape of a rhombus, an overlying transparent refraction structure 78 may have a horizontal cross-sectional shape of a rhombus.

Figure 15:
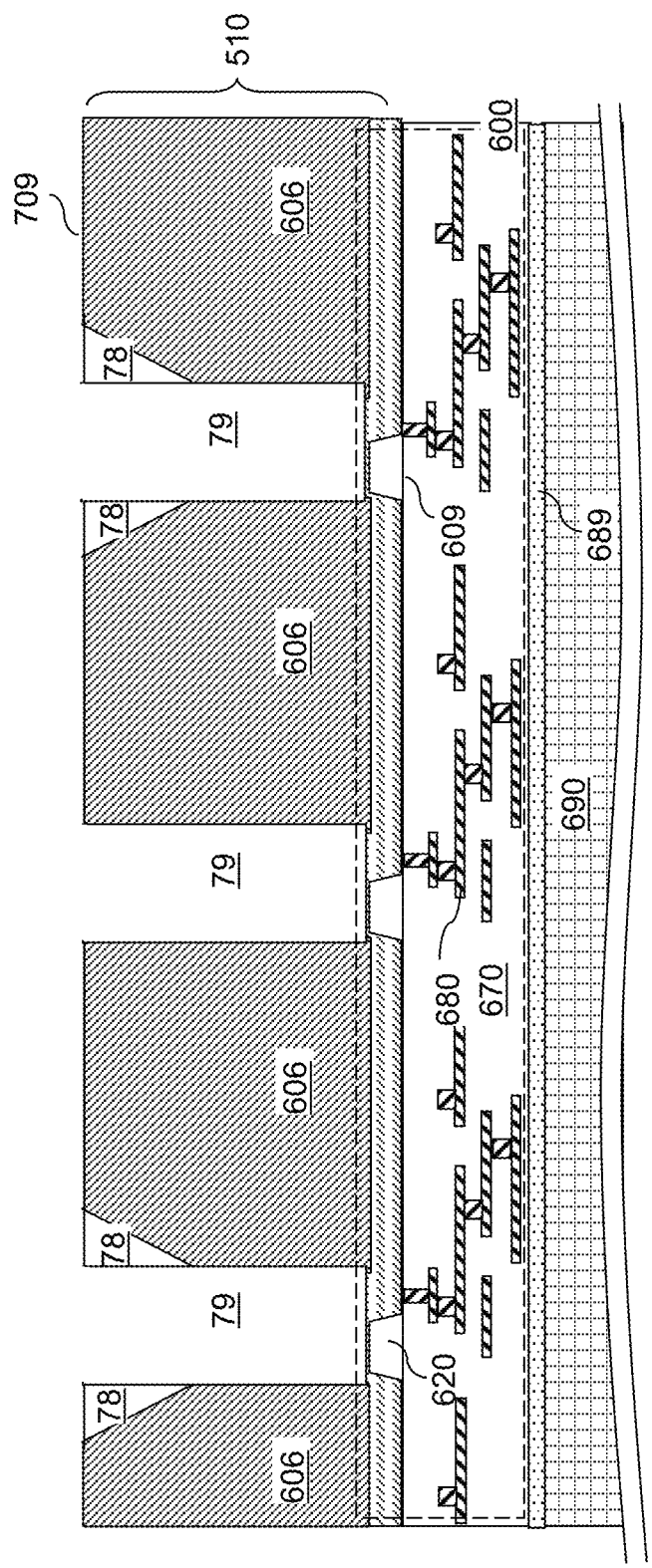
FIG. 15 is a vertical cross-sectional view of a region of an image pixel after formation of deep trenches according to the second embodiment of the present disclosure.

FIG. 15 is a vertical cross-sectional view of a region of an image pixel after formation of deep trenches according to the second embodiment of the present disclosure. Referring to FIG. 15, a photoresist layer (not shown) may be applied over the backside surface 709 of the thinned semiconductor substrate 510, and may be lithographically patterned to form a pattern of openings. The pattern of the openings in the photoresist layer may be the same as the pattern of openings in the photoresist layer used in the processing steps of FIGS. 6A and 6B. In one embodiment, the pattern of the openings in the photoresist layer may be the complement of the pattern of the second-conductivity-type pillar structures 606.

Unmasked portions of the semiconductor substrate 510 may be etched by performing an anisotropic etch process, which transfers the pattern of the openings in the photoresist layer into the semiconductor substrate 510. Interconnected deep trenches 79 may be formed by etching portions of the thinned semiconductor substrate 510 from the backside in areas that surround the second-conductivity-type pillar structures 606. Center portions of the transparent refraction structures 78 may be etched by the anisotropic etch process. In one embodiment, each transparent refraction structure 78 may be divided into a plurality of transparent refraction structures 78. Vertical sidewalls of the second-conductivity-type pillar structures 606 and the transparent refraction structures 78 may be physically exposed to the deep trenches 79. The depth of the deep trenches 79 may be in a range from 1 micron to 10 microns, such as from 1.5 microns to 8 microns. Deep trenches may be formed in the semiconductor substrate 510. The photoresist layer may be subsequently removed, for example, by ashing.

Figure 16:
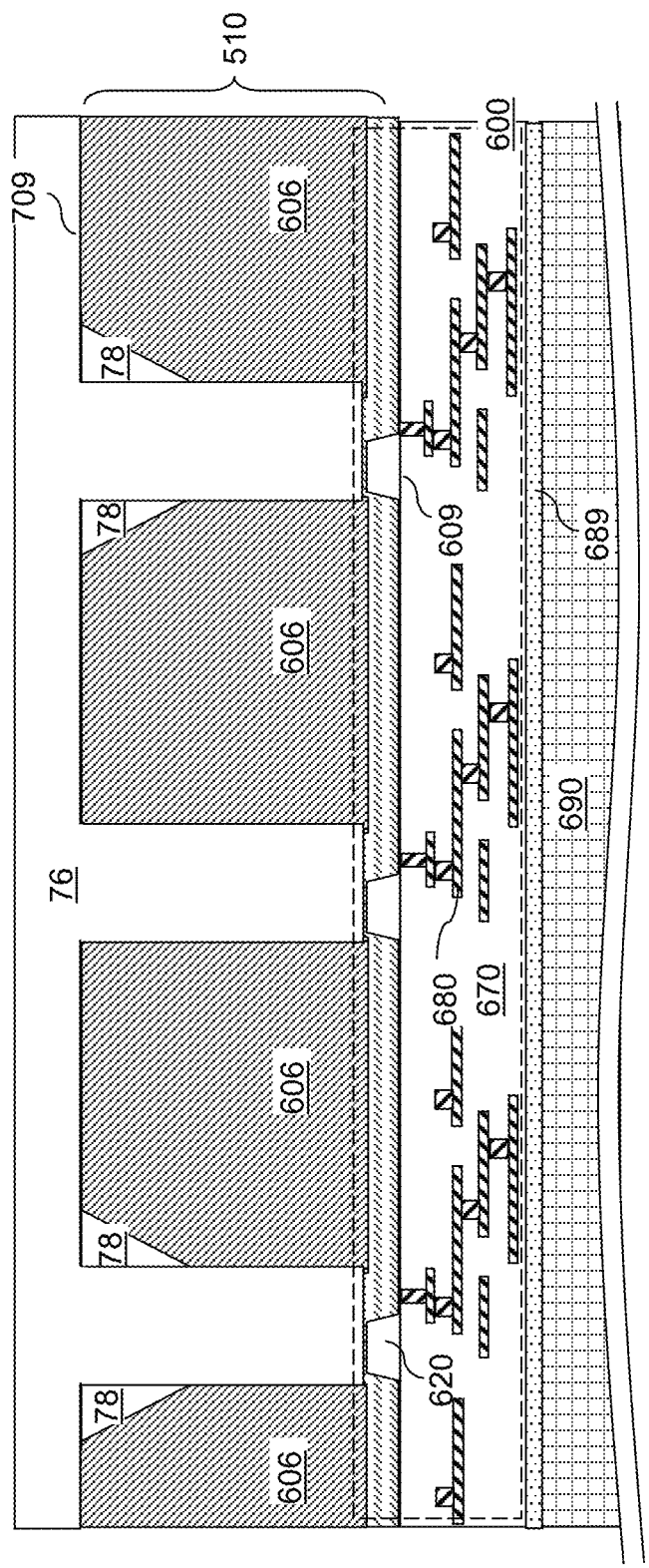
FIG. 16 is a vertical cross-sectional view of a region of an image pixel after formation of a deep trench isolation structure according to the second embodiment of the present disclosure.

FIG. 16 is a vertical cross-sectional view of a region of an image pixel after formation of a deep trench isolation structure according to the second embodiment of the present disclosure. Referring to FIG. 16, at least one optically transparent dielectric material such as silicon oxide or a polymer material may be deposited in the deep trenches 79 and over the backside surface 709 of the thinned semiconductor substrate 510 to form a deep trench isolation structure 76. The deep trench isolation structure 76 may laterally surround each second-conductivity-type pillar structure 606 and each transparent refraction structure 78 within a subpixel 800. In one embodiment, the deep trench isolation structure 76 may contact the bottom surfaces of the shallow trench isolation structures 620. The combination of the deep trench isolation structure 76 and the shallow trench isolation structures 620 may provide electrical isolation between each neighboring pair of photovoltaic junctions, between neighboring pairs of subpixels 800, and between neighboring pairs of image pixels 900.

Figure 17:
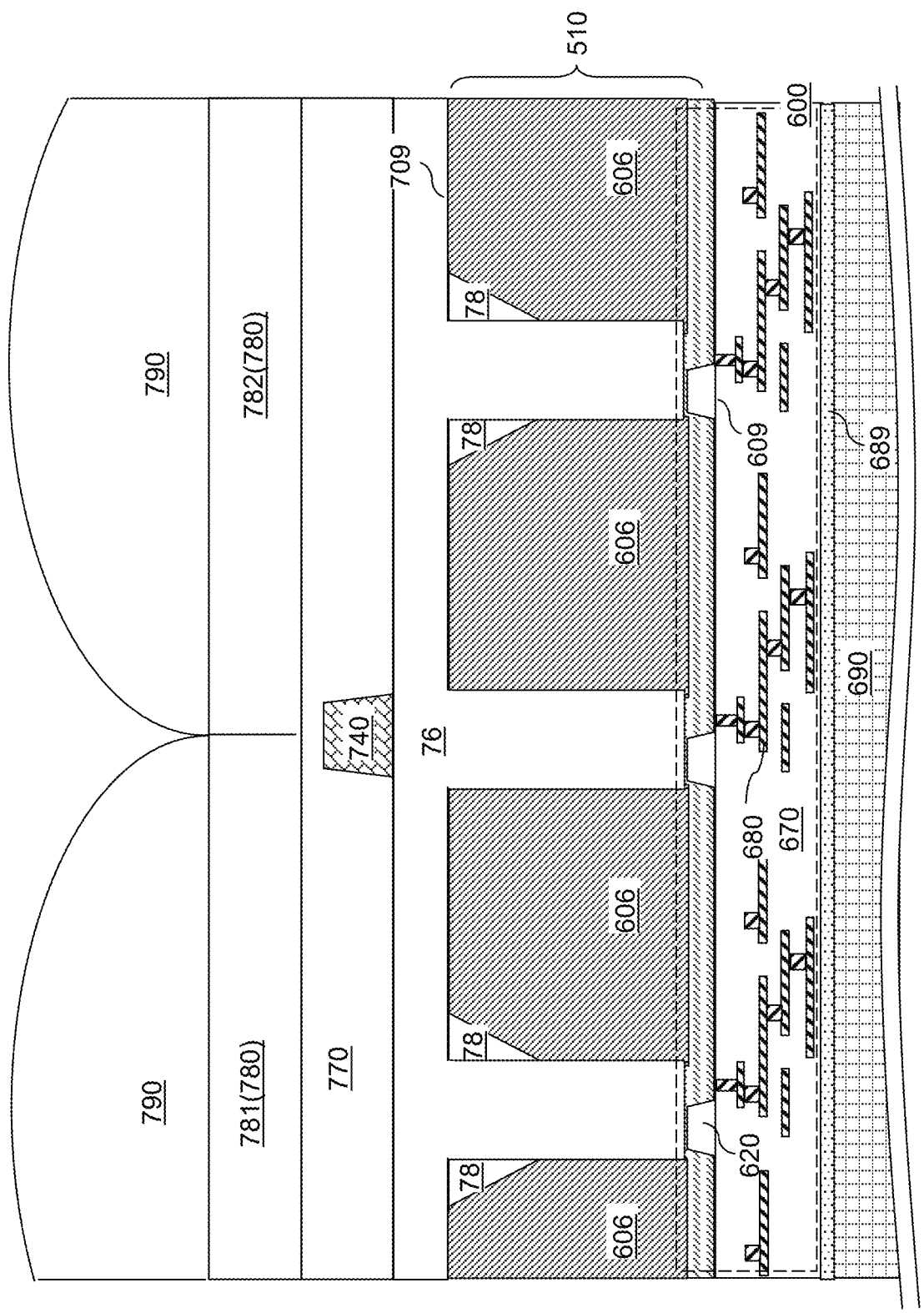
FIG. 17 is a vertical cross-sectional view of a region of an image pixel after formation of subpixel optics assemblies according to the second embodiment of the present disclosure.

FIG. 17 is a vertical cross-sectional view of a region of an image pixel after formation of subpixel optics assemblies according to the second embodiment of the present disclosure. Referring to FIG. 17, the processing steps of FIGS. 12A and 12B may be performed to form a grid structure 740 and subpixel optics assemblies (770, 780, 790). The carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Referring to FIGS. 1A-17 and according to various embodiments of the present disclosure, an image sensor comprising an array of image pixels 900 located on a semiconductor substrate 510 may be provided. Each image pixel 900 within the array of image pixels 900 comprises at least one subpixel 800. Each subpixel 800 comprises a plurality of photovoltaic junctions (602, 606, 603), a sensing circuit (640, 650, 660), a subpixel optics assembly (770, 780, 790) configured to direct incident light onto the plurality of photovoltaic junctions (602, 606, 603) and comprising an optical lens 790, and at least one transparent refraction structure 78. Each of the plurality of photovoltaic junctions (602, 606, 603) comprises a respective first-conductivity-type pinning layer 603 and a respective second-conductivity-type pillar structure 606. The at least one transparent refraction structure 78 contacts the second-conductivity-type pillar structures 606 at tapered interfaces.

In one embodiment, the first-conductivity-type pinning layers 603 are located on a front surface 609 of the semiconductor substrate 510, and the second-conductivity-type pillar structures 606 are located on a backside surface 709 of the semiconductor substrate 510. In one embodiment, each subpixel 800 comprises a deep trench isolation structure 76 that laterally surrounds, and contacts, each of the second-conductivity-type pillar structures 606.

According to the first embodiment of the present disclosure, the at least one transparent refraction structure 78 comprises a single transparent refraction structure 78 that contacts each of the second-conductivity-type pillar structures 606 within each subpixel 800. In one embodiment, the single transparent refraction structure 78 comprises tapered sidewalls that contact a horizontally-extending portion of the deep trench isolation structure 76 overlying and contacting the backside surface 709 of the semiconductor substrate 510. In one embodiment, a horizontal surface of the single transparent refraction structure 78 contacts a horizontally-extending portion of the deep trench isolation structure 76, and is vertically spaced from the backside surface 709 of the semiconductor substrate 510.

According to the second embodiment of the present disclosure, the at least one transparent refraction structure 78 comprises a plurality of transparent refraction structures 78 that contacts a respective one of the second-conductivity-type pillar structures 606 within each subpixel 800. In one embodiment, vertically-extending portions of the deep trench isolation structure 76 laterally surround the plurality of transparent refraction structures 78, and a horizontally-extending portion of the deep trench isolation structure 76 overlies, and contacts, each of the plurality of transparent refraction structures 78. In one embodiment, each of the plurality of transparent refraction structures 78 comprises a horizontal surface located within a horizontal plane including the backside surface 709 of the semiconductor substrate 510 and contacts a horizontally-extending portion of the deep trench isolation structure 76.

In one embodiment, the at least one transparent refraction structure 78 has a variable thickness that decreases with a lateral distance from a vertical axis VA passing through a focal point FP of the optical lens 790 within each subpixel 800. Generally, a subpixel optics assembly (770, 780, 790) comprising an optical lens 790 may be formed over each transparent refraction structure 78. The subpixel optics assembly (770, 780, 790) in each subpixel 800 may be configured to direct incident light onto the plurality of photovoltaic junctions underneath. In one embodiment, the focal point FP of the subpixel optics assembly (770, 780, 790) in each subpixel 800 may be located on the vertical axis VA passing through the geometrical center of the set of second-conductivity-type pillar structures 606 of the subpixel 800.

Figure 18A:
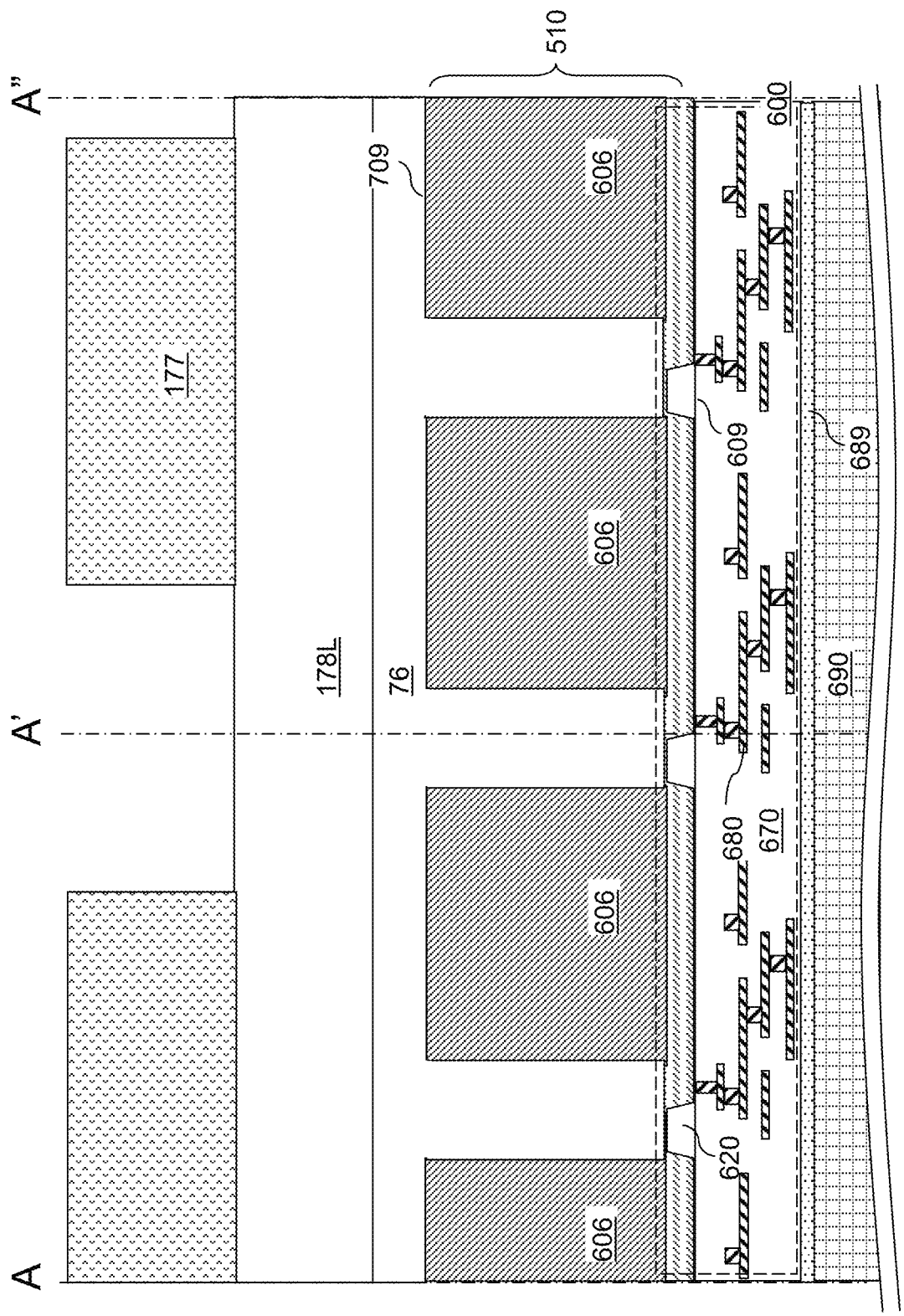
FIG. 18A is a vertical cross-sectional view of a region of an image pixel after formation of a transparent dielectric material layer and a patterned photoresist layer according to a third embodiment of the present disclosure.
Figure 18B:
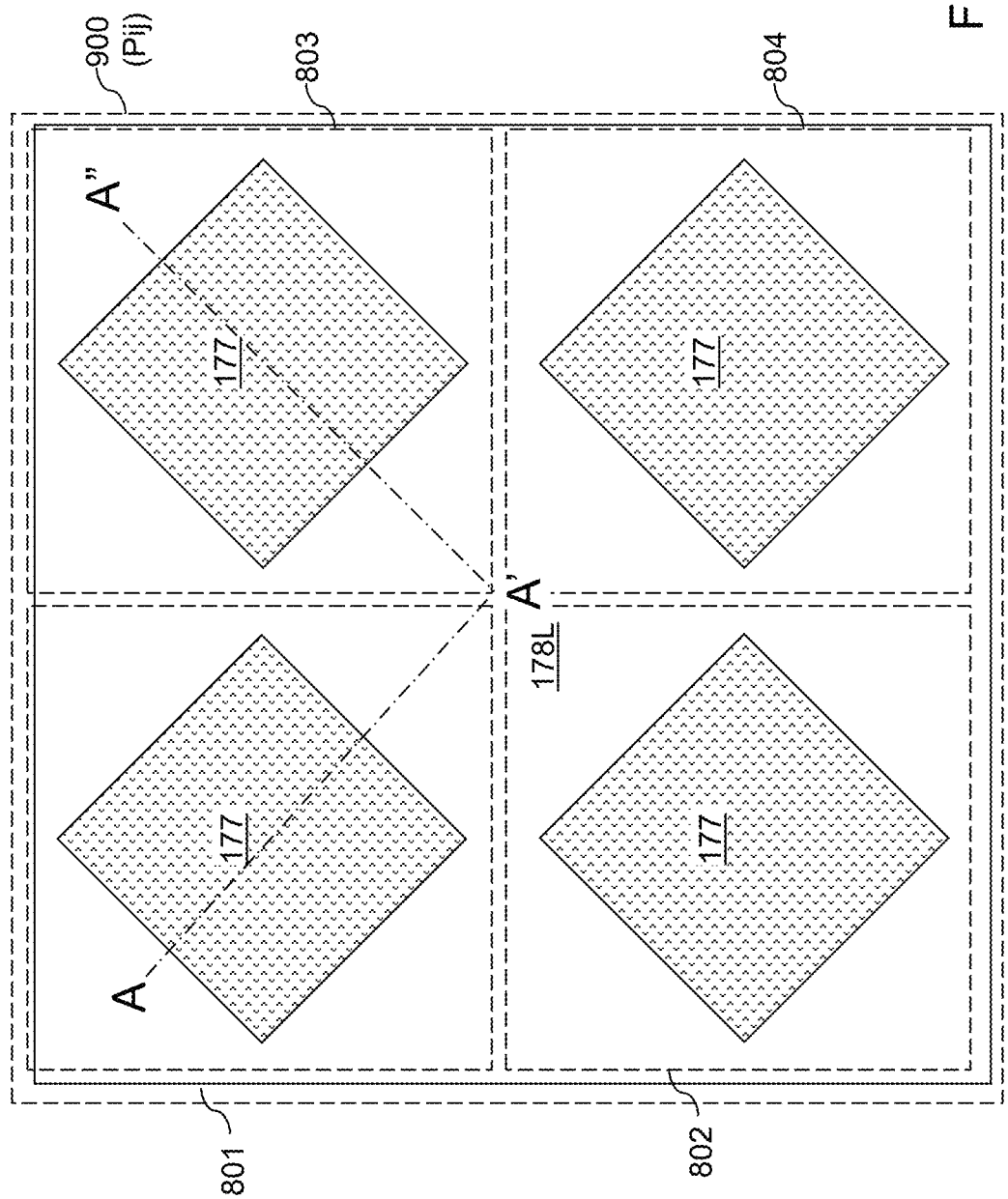
FIG. 18B is a top-down view of the image pixel of FIG. 18A. The hinged vertical plane A-A'-A" corresponds to the plane of the vertical cross-sectional view of FIG. 18A that includes the vertical axes A, A', and A".

FIG. 18A is a vertical cross-sectional view of a region of an image pixel after formation of a transparent dielectric material layer and a patterned photoresist layer 177 according to a third embodiment of the present disclosure. FIG. 18B is a top-down view of the image pixel of FIG. 18A. The hinged vertical plane A-A'-A" corresponds to the plane of the vertical cross-sectional view of FIG. 18A that includes the vertical axes A, A', and A". Referring to FIGS. 18A and 18B, a region of an image pixel 900 according to a third embodiment of the present disclosure is illustrated. The structure illustrated in FIGS. 18A and 18B may be derived from the structure of FIG. 7 by depositing a transparent dielectric material layer 178L over the horizontal top surface of the deep trench isolation structure 76. The transparent dielectric material layer 178L includes an optically transparent material. In one embodiment, the transparent dielectric material layer 178L may include a dielectric material having a higher refractive index than the refractive index of the material of the deep trench isolation structure 76. In one embodiment, the transparent dielectric material layer 178L may include silicon oxide, silicon nitride, or a dielectric metal oxide. The thickness of the transparent dielectric material layer 178L may be in a range from 200 nm to 2,000 nm, such as from 400 nm to 1,000 nm, although lesser and greater thicknesses may also be used.

Figure 19A:
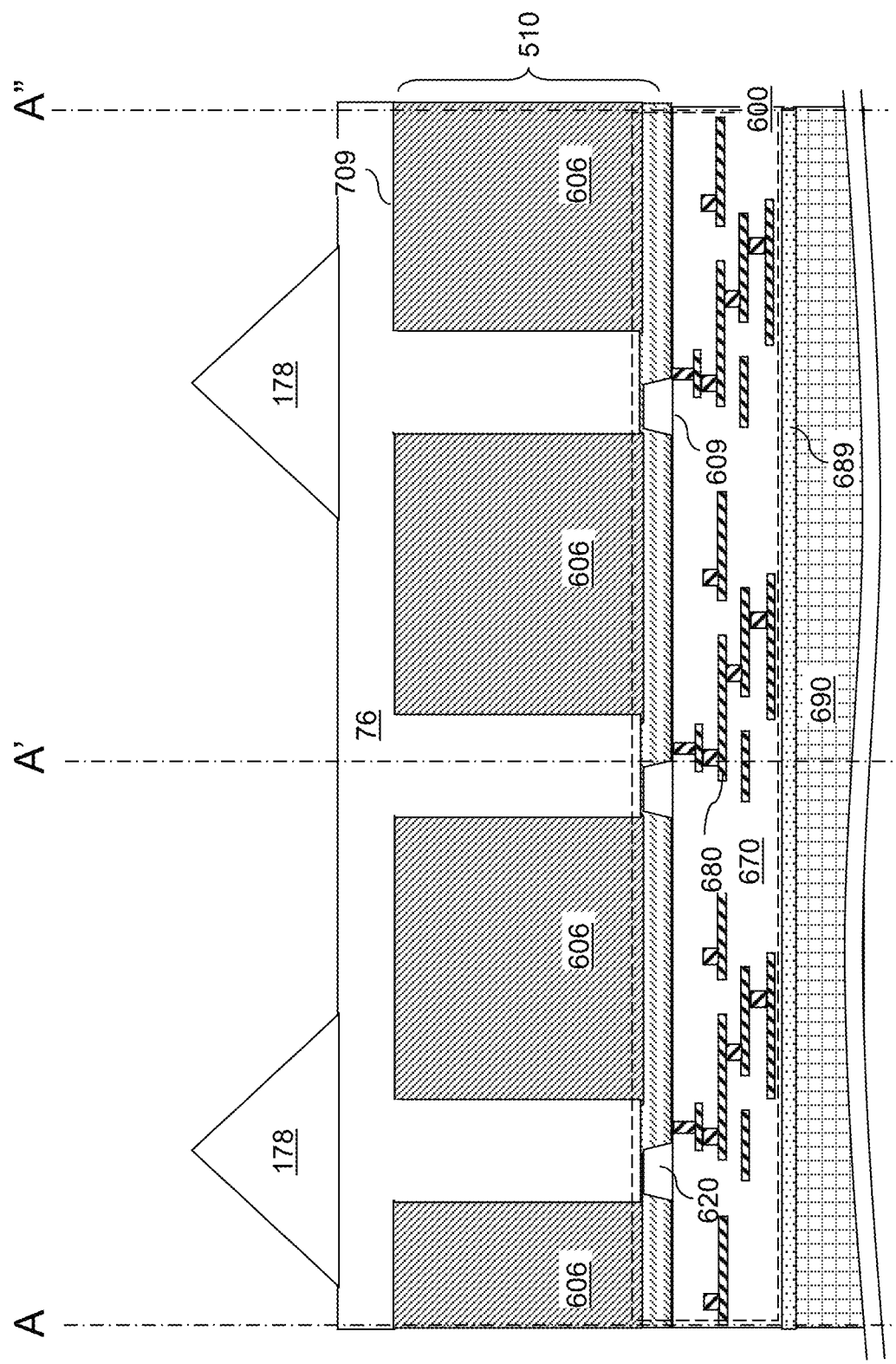
FIG. 19A is a vertical cross-sectional view of a region of an image pixel after formation of a transparent refraction structures according to a third embodiment of the present disclosure.
Figure 19B:
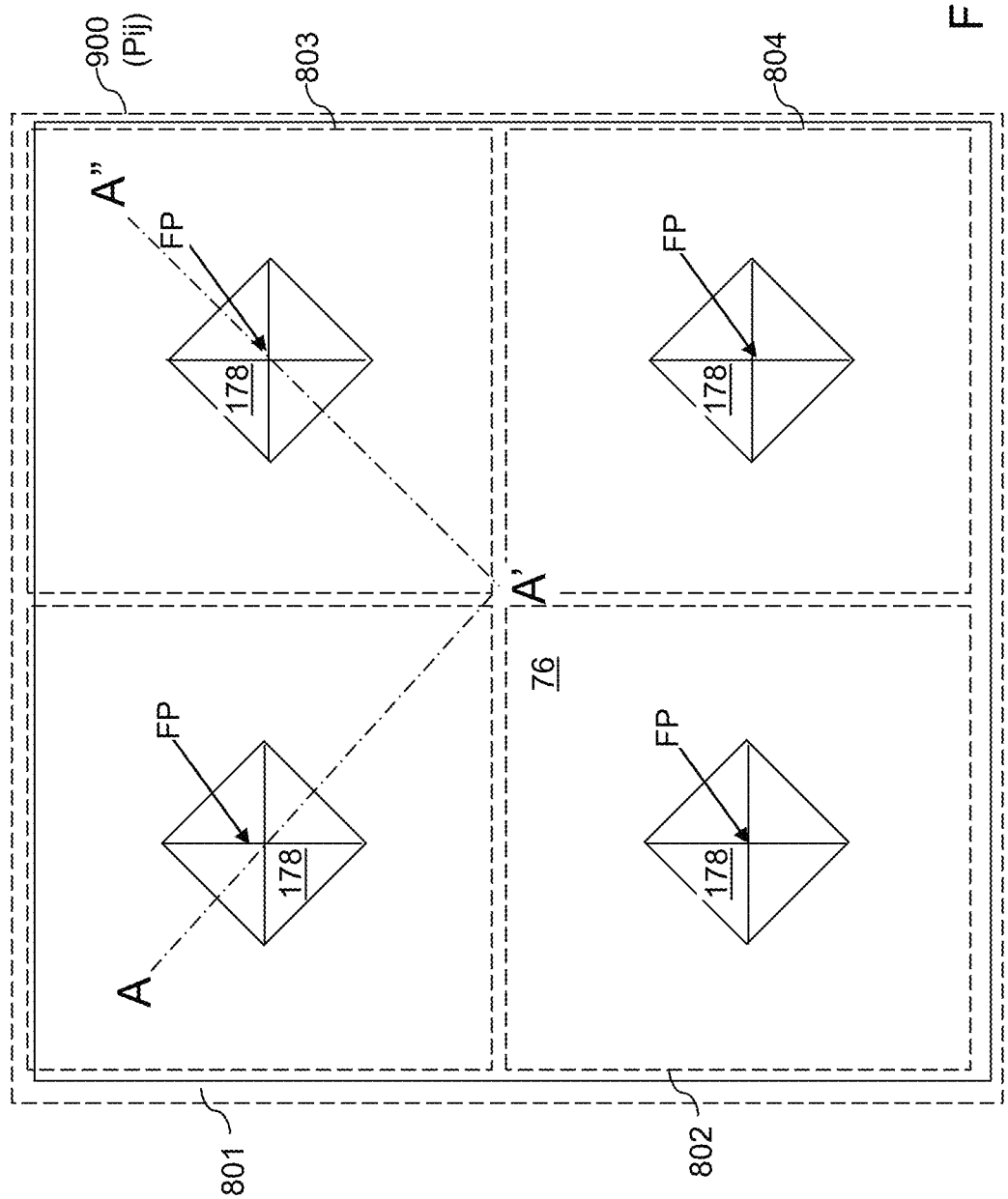
FIG. 19B is a top-down view of the image pixel of FIG. 19A. The hinged vertical plane A-A'-A" corresponds to the plane of the vertical cross-sectional view of FIG. 19A that includes the vertical axes A, A', and A".

FIG. 19A is a vertical cross-sectional view of a region of an image pixel after formation of a transparent refraction structures according to a third embodiment of the present disclosure. FIG. 19B is a top-down view of the image pixel of FIG. 19A. The hinged vertical plane A-A'-A" corresponds to the plane of the vertical cross-sectional view of FIG. 19A that includes the vertical axes A, A', and A". Referring to FIGS. 19A and 19B, a photoresist layer (not shown) may be applied over the transparent dielectric material layer 178L, and may be lithographically patterned to cover discrete areas around each vertical axis VA passing through the geometrical center of a set of second-conductivity-type pillar structures 606 within a respective subpixel 800. The horizontal cross-sectional shape of each patterned portion of the photoresist layer may be a shape of a rhombus, a circle, a rectangle, or any two-dimensional shape having an n-fold rotational symmetry in which n is the total number of second-conductivity-type pillar structures 606 within an underlying subpixel 800.

An isotropic etch process may be performed to etch unmasked portions of the transparent dielectric material layer 178L. In one embodiment, the isotropic etch process may use an etchant that etches the material of the transparent dielectric material layer 178L selective to the material of the deep trench isolation structure 76. For example, if the deep trench isolation structure 76 includes silicon oxide and if the transparent dielectric material layer 178L includes silicon nitride, a wet etch process using hot phosphoric acid may be performed. Each remaining portion of the transparent dielectric material layer 178L after the isotropic etch process comprises a transparent refraction structure 178. The sidewalls of the transparent dielectric material layer 178L are tapered, and may be concave or may be planar.

Each transparent refraction structure 178 may be formed over the backside surface 709 of the thinned semiconductor substrate 510, and may be formed over the horizontally-extending portion of the deep trench isolation structure 76. In one embodiment, each transparent refraction structure 178 may have a variable thickness that decreases with a lateral distance from a vertical axis VA passing through a geometrical center of the second-conductivity-type pillar structures 606 of a respective subpixel 800. In one embodiment, the transparent refraction structure 178 comprises an apex located on a vertical axis VA passing through a focal point FP of the optical lens 790. Generally, the horizontal cross-sectional shape of each transparent refraction structure 178 may be the same as, or may be similar to, the shape of the boundary of an underlying portion of the substrate semiconductor layer 601 that is laterally bounded by a set of second-conductivity-type pillar structures 606 within a subpixel 800. For example, if the boundary of an underlying portion of the substrate semiconductor layer 601 that is laterally bounded by a set of second-conductivity-type pillar structures 606 within a subpixel 800 has a shape of a rhombus, an overlying transparent refraction structure 178 may have a horizontal cross-sectional shape of a rhombus.

Figure 20:
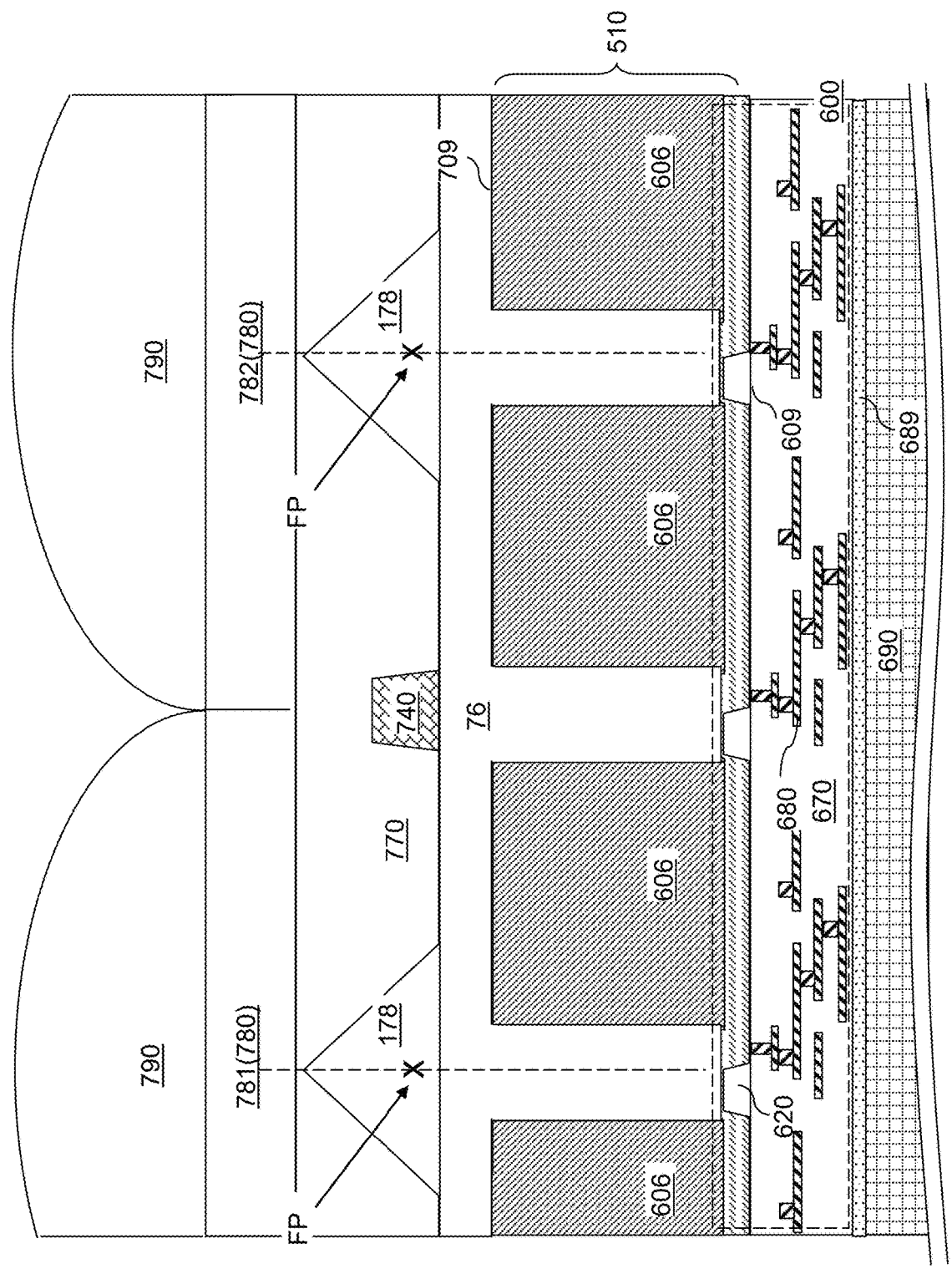
FIG. 20 is a vertical cross-sectional view of a region of a image pixel after formation of subpixel optics assemblies according to the third embodiment of the present disclosure.

FIG. 20 is a vertical cross-sectional view of a region of a image pixel after formation of subpixel optics assemblies according to the third embodiment of the present disclosure. Referring to FIG. 20, the processing steps of FIGS. 12A and 12B may be performed to form a grid structure 740 and subpixel optics assemblies (770, 780, 790). The carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Generally, a subpixel optics assembly (770, 780, 790) comprising an optical lens 790 may be formed over each transparent refraction structure 78. The subpixel optics assembly (770, 780, 790) in each subpixel 800 may be configured to direct incident light onto the plurality of photovoltaic junctions underneath. In one embodiment, the focal point FP of the subpixel optics assembly (770, 780, 790) in each subpixel 800 may be located on the vertical axis VA passing through the geometrical center of the set of second-conductivity-type pillar structures 606 of the subpixel 800.

Referring to FIGS. 1A-7 and 18A-20 and according to various embodiments of the present disclosure, an image sensor comprising an array of image pixels 900 located on a semiconductor substrate 510 is provided. Each image pixel 900 within the array of image pixels comprises at least one subpixel 800. Each subpixel 800 comprises a plurality of photovoltaic junctions (602, 606, 603) located between a front surface 609 and a backside surface 709 of the semiconductor substrate 510, a sensing circuit (640, 650, 660), a subpixel optics assembly (770, 780, 790) overlying the backside surface 709 and configured to direct incident light onto the plurality of photovoltaic junctions (602, 606, 603) and comprising an optical lens 790, and a transparent refraction structure 78, 178 located between the optical lens 790 and the backside surface 709 and having a variable thickness that decreases with a lateral distance from a vertical axis VA passing through a focal point FP of the optical lens 790. Each of the plurality of photovoltaic junctions (602, 606, 603) comprises a respective first-conductivity-type pinning layer 603 and a respective second-conductivity-type pillar structure 606.

In one embodiment, each subpixel 800 comprises a deep trench isolation structure 76 that laterally surrounds, and contacts, each of the second-conductivity-type pillar structures 606. The transparent refraction structure 178 in each subpixel 800 overlies a horizontally extending portion of the deep trench isolation structure 76 that contacts the backside surface 709 of the semiconductor substrate 510.

In one embodiment, a bottom surface of the transparent refraction structure 178 contacts a horizontal surface of a horizontally-extending portion of the deep trench isolation structure 76. In one embodiment, the transparent refraction structure 178 comprises an apex located on a vertical axis VA passing through a focal point FP of the optical lens 790.

Figure 21:
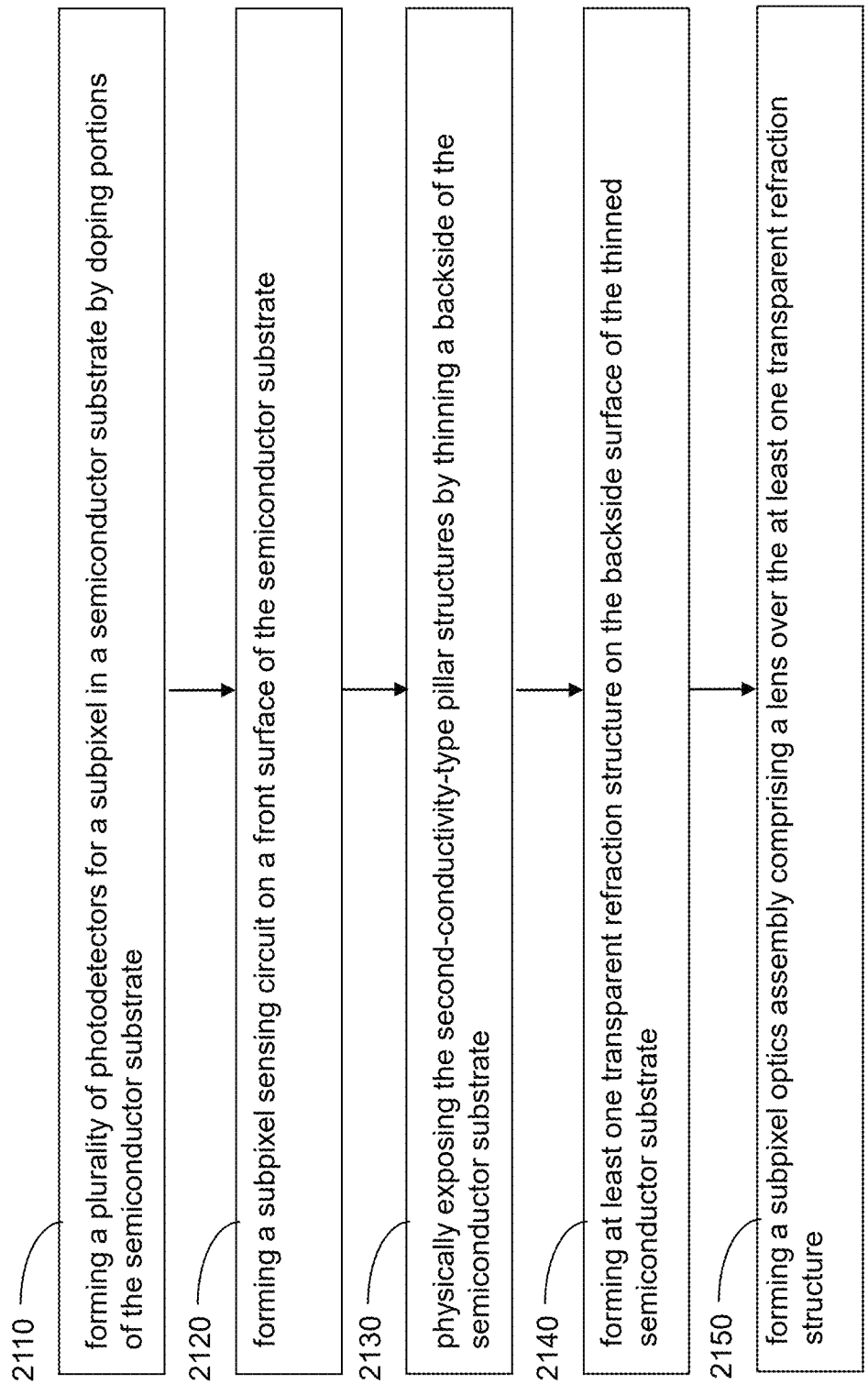
FIG. 21 is a process flow diagram illustrating an exemplary process sequence for forming an image sensor according to an embodiment of the present disclosure.

Referring to FIG. 21, a process flow diagram illustrates an exemplary process sequence for forming an image sensor according to an embodiment of the present disclosure. Referring to step 2110 and FIGS. 2A, 2B, and 3A-3D, a plurality of photovoltaic junctions (602, 606, 603) for a subpixel 800 may be formed in a semiconductor substrate 500 by doping portions of the semiconductor substrate 500. Each of the plurality of photovoltaic junctions (602, 606, 603) comprises a respective first-conductivity-type pinning layer 603 and a respective second-conductivity-type pillar structure 606. Referring to step 2120 and FIGS. 2A, 2B, and 3A-3D, a sensing circuit (640, 650, 660) may be formed on a front surface 609 of the semiconductor substrate 500. Referring to step 2130 and FIGS. 4 and 5, the second-conductivity-type pillar structures 606 may be physically exposed by thinning a backside of the semiconductor substrate 500. A backside surface 709 of a thinned semiconductor substrate 510 is physically exposed. Referring to step 2140 and FIGS. 6A-11B, 13A-16, and 18A-19B, at least one transparent refraction structure (78, 178) may be formed on the backside surface 709 of the thinned semiconductor substrate 510. Each of the at least one transparent refraction structure (78, 178) has a variable thickness that decreases with a lateral distance from a vertical axis VA passing through a geometrical center of the second-conductivity-type pillar structures 606. Referring to step 2150 and FIGS. 12A and 12B, 17, and 20, a subpixel optics assembly (770, 780, 790) comprising an optical lens 790 may be formed over the at least one transparent refraction structure (78, 178). The subpixel optics assembly (770, 780, 790) is configured to direct incident light onto the plurality of photovoltaic junctions (602, 606, 603).

The various embodiments of the present disclosure may be used to provide subpixels 800 in which the incident light that passes through an optical lens 790 is further refracted by the at least one transparent refraction structure (78, 178) at a tapered interface with a second-conductivity-type pillar structure 606 such that reflection at a sidewall of the second-conductivity-type pillar structure 606, and the direction of the light within the second-conductivity-type pillar structure 606 is more conducive to total reflection. Thus, an image sensor using the transparent refraction structures (78, 178) of the present disclosure may provide higher light capture efficiency and higher image resolution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising an array of image pixels located on a semiconductor substrate, wherein:
    each image pixel within the array of image pixels comprises at least one subpixel; and
    each subpixel comprises a plurality of photovoltaic junctions located between a front surface and a backside surface of the semiconductor substrate, a subpixel optics assembly overlying the backside surface and configured to direct incident light onto the plurality of photovoltaic junctions and comprising an optical lens, a transparent refraction structure located between the optical lens and the backside surface and having a variable thickness and a horizontal bottom surface located within a first horizontal plane, and an optically transparent layer having a different index of refraction than the transparent refraction structure, laterally surrounding the transparent refraction structure, and having a planar bottom surface located within the first horizontal plane, wherein:
    the transparent refraction structure has a variable thickness that decreases with a lateral distance from a vertical axis passing through a focal point of the optical lens;
    each of the plurality of photovoltaic junctions comprises a respective first-conductivity-type pinning layer and a respective second-conductivity-type pillar structure;
    each subpixel comprises a deep trench isolation structure that laterally surrounds, and contacts, each of the second-conductivity-type pillar structures; and
    the transparent refraction structure in each subpixel overlies a horizontally extending portion of the deep trench isolation structure that contacts the backside surface of the semiconductor substrate.

2. The image sensor of claim 1, wherein the focal point of the optical lens located within the transparent refraction structure.

3. The image sensor of claim 1, wherein the deep trench isolation structure includes a horizontally-extending portion that overlies the backside surface of the semiconductor substrate, and a plurality of vertically-extending portions that are interconnected among one another and vertically extending from the horizontally-extending portion toward the front surface of the semiconductor substrate.

4. The image sensor of claim 3, further comprising shallow trench isolation structures located within the semiconductor substrate and vertically extending from the front surface of the semiconductor substrate toward the backside surface of the semiconductor substrate.

5. The image sensor of claim 4, wherein:
horizontal surfaces of the vertically-extending portions of the deep trench isolation structure contact horizontal surfaces of the shallow trench isolation structure; and
each of the photovoltaic junctions is laterally surrounded by a respective portion of the deep trench isolation structure and a respective portion of the shallow trench isolation structure.

6. The image sensor of claim 3, wherein the transparent refraction structure comprises horizontal planar surface that contacts a horizontal planar surface of the horizontally-extending portion of the deep trench isolation structure.

7. The image sensor of claim 3, further comprising an optically transparent layer overlying the deep trench isolation structure, laterally surrounding the transparent refraction structure, and having a horizontal top surface overlying an apex of the transparent refraction structure.

8. The image sensor of claim 7, wherein the apex of the transparent refraction structure is located on a vertical axis passing through a focal point of the optical lens.

9. The image sensor of claim 7, wherein the transparent refraction structure comprises a plurality of facets that are adjoined among one another at edges between neighboring pairs of facets among the plurality of facets, and adjoined among one another at the apex.

10. An image sensor comprising an array of image pixels located on a semiconductor substrate, wherein:
each image pixel within the array of image pixels comprises at least one subpixel;
each subpixel comprises a plurality of photovoltaic junctions located between a front surface and a backside surface of the semiconductor substrate, a sensing circuit, a subpixel optics assembly overlying the backside surface and configured to direct incident light onto the plurality of photovoltaic junctions and comprising an optical lens, and a transparent refraction structure located between the optical lens and the backside surface and having a variable thickness that decreases with a lateral distance from a vertical axis passing through a focal point of the optical lens; and
each of the plurality of photovoltaic junctions comprises a respective first-conductivity-type pinning layer and a respective second-conductivity-type pillar structure, wherein:
each subpixel comprises a deep trench isolation structure that laterally surrounds, and contacts, each of the second-conductivity-type pillar structures; and
the transparent refraction structure in each subpixel overlies a horizontally extending portion of the deep trench isolation structure that contacts the backside surface of the semiconductor substrate.

11. The image sensor of claim 10, wherein a bottom surface of the transparent refraction structure contacts a horizontally-extending portion of the deep trench isolation structure.

12. The image sensor of claim 10, wherein the transparent refraction structure comprises an apex located on a vertical axis passing through a focal point of the optical lens.

13. An image sensor comprising an array of image pixels located on a semiconductor substrate, wherein:
each image pixel within the array of image pixels comprises at least one subpixel; and
each subpixel comprises a plurality of photovoltaic junctions located between a front surface and a backside surface of the semiconductor substrate, a subpixel optics assembly overlying the backside surface, comprising a transparent material layer, and configured to direct incident light onto the plurality of photovoltaic junctions and comprising an optical lens, and a transparent refraction structure embedded within the transparent material layer and having a different index of refraction than the transparent material layer and a horizontal bottom surface located within a first horizontal plane, wherein:
the transparent refraction structure has a variable thickness that decreases with a lateral distance from a vertical axis passing through a focal point of the optical lens;
each of the plurality of photovoltaic junctions comprises a respective first-conductivity-type pinning layer and a respective second-conductivity-type pillar structure;
each subpixel comprises a deep trench isolation structure that laterally surrounds, and contacts, each of the second-conductivity-type pillar structures; and
the transparent refraction structure in each subpixel overlies a horizontally extending portion of the deep trench isolation structure that contacts the backside surface of the semiconductor substrate.

14. The image sensor of claim 13, wherein the transparent refraction structure is located between the optical lens and the backside surface.

15. The image sensor of claim 13, wherein the transparent refraction structure has a horizontal cross-sectional shape of a rhombus.

16. The image sensor of claim 13, wherein the transparent refraction structure has a plurality of facets that are not horizontal and not vertical and are adjoined at an apex.

17. The image sensor of claim 16, wherein the apex and a focal point of the optical lens are located within a same vertical line.

18. The image sensor of claim 1, wherein:
an entirety of the horizontal top surface of the optically transparent layer is located within the second horizontal plane; and
the second horizontal plane overlies, and is vertically spaced from, a topmost point of the transparent refraction structure.

19. The image sensor of claim 10, wherein the transparent refraction structure comprises a plurality of facets that are not horizontal and not vertical and are adjoined among one another at edges between neighboring pairs of facets among the plurality of facets, and adjoined among one another at an apex.

20. The image sensor of claim 10, further comprising shallow trench isolation structures located within the semiconductor substrate and vertically extending from the front surface of the semiconductor substrate toward the backside surface of the semiconductor substrate, wherein:
horizontal surfaces of vertically-extending portions of the deep trench isolation structure contact horizontal surfaces of the shallow trench isolation structures; and
each of the photovoltaic junctions is laterally surrounded by a respective portion of the deep trench isolation structure and a respective portion of the shallow trench isolation structure.

* * * * *